(12) United States Patent
Yasufuku et al.

(10) Patent No.: US 6,278,610 B1
(45) Date of Patent: Aug. 21, 2001

(54) CONNECTOR FOR MODULE

(75) Inventors: Kaori Yasufuku; Tai ji Hosaka, both of Yokohama; Masaaki Miyazawa, Kawasaki, all of (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 09/643,962

(22) Filed: Aug. 23, 2000

(30) Foreign Application Priority Data

Dec. 28, 1999 (JP) .................................................. 11-375704

(51) Int. Cl.[7] ........................................................ H05K 7/20
(52) U.S. Cl. ............................ 361/704; 361/715; 361/719; 361/755; 174/16.3; 174/252; 165/80.3; 165/185; 439/485; 439/630
(58) Field of Search ..................................... 361/704, 707, 361/708, 719, 720, 715; 174/16.1, 16.3, 252, 52.4; 165/80.2, 80.3; 439/630, 485, 487

(56) References Cited

U.S. PATENT DOCUMENTS

| | | | |
|---|---|---|---|
| 5,161,087 | * 11/1992 | Frankeny et al. | 361/702 |
| 5,764,482 | * 6/1998 | Meyer, IV et al. | 361/699 |
| 6,088,228 | * 7/2000 | Peterson et al. | 361/720 |
| 6,188,576 | * 2/2001 | Ali et al. | 361/704 |

* cited by examiner

Primary Examiner—Leo P. Picard
Assistant Examiner—Boris L. Chervinsky
(74) Attorney, Agent, or Firm—Nixon Peabody LLP; Donald R. Studebaker

(57) ABSTRACT

A connector for module that connects a module to a printed circuit board in a position wherein the board plane of the module is approximately parallel to the printed circuit board. This connector comprises a connector body having a receiving part that extends along the front side of the module being in the connection position, having a contact that are provided in the receiving part and contact the conductive pad while allowing the pad to shift in the direction of insertion/withdrawal, and having a supporting part that extends rearward from the receiving part to carry the module being in the connection position and limits shifting of the module in the front-rear direction and the left-right direction, a metallic cover that is put over and is engaged to the connector body to sandwich the module between itself and the supporting part and keep the module in the connection position, having a window for exposing semiconductor chip of the module being in the connection position, and a heat sink that is arranged to contact the semiconductor chip in the windows and is connected to the metallic cover by a supporting structure that enables variation of the angle of fitting.

This connector prevents defective connection or the like of the module due to thermal load, etc., reduces the effects of electromagnetic waves, etc. on the connector by its shielding function to maintain the operation of circuits stable, and cools the semiconductor chip to maintain their operation stable.

4 Claims, 38 Drawing Sheets

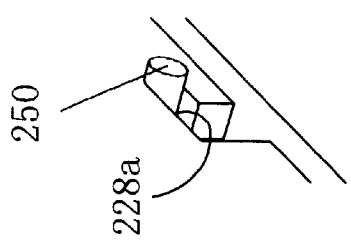
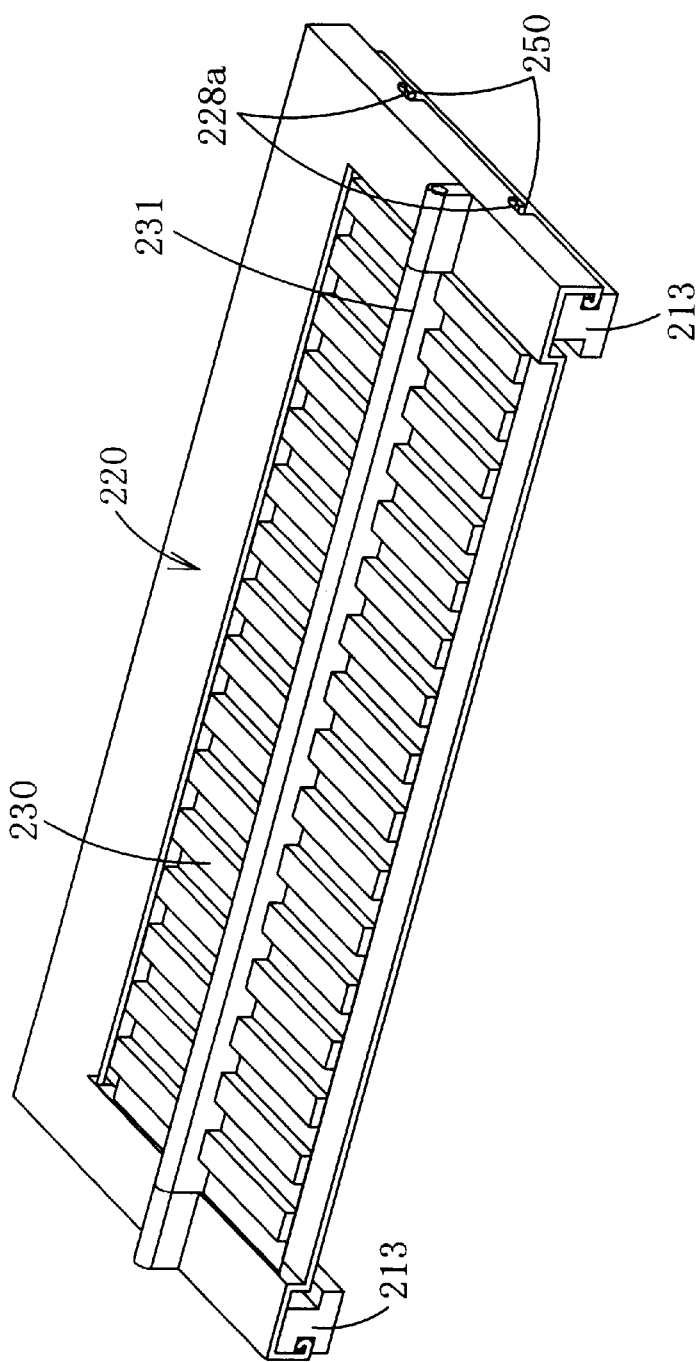

CONNECTOR FOR MODULE

BACKGROUND OF THE INVENTION

1. Field of the Invention

The present invention belongs to a technical field of connector for module (hereinafter it may be simply referred to as connector) that is used for a module wherein semiconductor chips are mounted on a rectangular board and conductive pads are provided on a front side of the board (hereinafter simply referred to as module). In particular, the present invention relates to countermeasures against heat, electromagnetic waves, etc. to which a connector for module is exposed.

2. Related Art

Modules of this kind include those in which semiconductor chips such as semiconductor memories are mounted. A module connector is used extensively, which connects a module of this kind to a printed circuit board such as a mother board in a position wherein the board surface of the module is approximately parallel to the printed circuit board. This connector has an approximately U-shaped form to correspond to the front side, left side and right side of the module, respectively. A receiving part of the connector corresponding to this front side is provided with a groove that will receive the front side of the module. The groove is provided with contacts that will contact conductive pads while allowing the conductive pads to move in a direction of insertion/withdrawal when the module is in an insertion/withdrawal position in which the rear side thereof is lifted more in comparison with its level in the connection position. Two arms of the connector corresponding to the left side and the right side of the module are arranged so that their top ends can undergo elastic deformation leftward and rightward, respectively, and each arm is provided with a engaging claw on the inner side of the top end thereof. The connector is mounted on the printed circuit board by soldering the solder tails of the contacts onto the printed circuit board. When the module is to be fitted into the connector, first, the module is set in the insertion/withdrawal position and the front side of the module is inserted between the contacts. Next, the rear side of the module is pushed downward. As a result, the conductive pads and contacts are made to contact with each other. When the left side and the right side are pressed against the arms, the top ends of the arms will undergo elastic deformation outward and the engaging claws will fit into the left side and the right side of the module. As a result, the module will be retained in the connection position. When the fitted module is to be disconnected from the connector, the top ends of the arms are made by fingers to undergo elastic deformation outward to release the engaging claws from the module. The rear side of the module will be lifted by the elastic recovering forces of the contacts and the module will be shifted from the connection position into the insertion/withdrawal position. Thus the module can be withdrawn from the space between the contacts.

Semiconductor memories show a tendency to increase their heat generation significantly. It is due to, for example, quickening of their operating speed that is a result of the speed-up of the CPU. This thermal load may cause deformation of the arms of the connector, which in turn may result in loss of the engaging function of the engaging members. Outward elastic deformation of the top ends of the arms by fingers may cause plastic deformation of the arms. The loss of the engaging function and the deformation may cause defective connection and/or disconnection of the module.

Heat generation also poses a problem that it may make the operation of the semiconductor memories unstable. Moreover, if the connector is exposed to the effects of ambient electromagnetic waves or the like, the operation of the circuits may become unstable. The above-mentioned problems are not limited to the connectors for modules having semiconductor memories. They are common to connectors for modules having general semiconductor chips.

SUMMARY OF THE INVENTION

One objective of the present invention is to prevent defective connection and disconnection of the module due to thermal load on the connector body and its elastic deformation by reinforcing the connector body with a metallic cover, to reduce effects of electromagnetic waves or the like on the connector for module and keep the operation of the circuit stable by covering and shielding the connector with the metallic cover, and to cool the semiconductor chip and keep the operation of the semiconductor chip stable by using the metallic cover and making a heat sink have surface-to-surface contact with the semiconductor chip.

The connector for module according to the present invention is a connector for module that connects a module, which has a semiconductor chip mounted on a rectangular board and has a conductive pad on the front side of the board, to a printed circuit board in a position wherein the board plane is approximately parallel to the printed circuit board, and this connector for module, comprises:

a connector body having a receiving part that extends along the front side of a module being in the connection position, having a contact that is provided in the receiving part and contacts the conductive pad while allowing the pad to shift in the direction of insertion/withdrawal, and having a supporting part that extends rearward from the receiving part to carry the module being in the connection position and limits shifting of the module in the front-rear direction and the left-right direction;

a metallic cover that is put over and is engaged to the connector body to sandwich the module between itself and the supporting part and keep the module in the connection position, having a window for exposing the semiconductor chip of the module being in the connection position; and a heat sink that is arranged to contact the semiconductor chip in the window and is connected to the metallic cover by a supporting structure that enables variation of the angle of fitting to the metallic cover.

This connector for module is mounted on a printed circuit board by, for example, soldering the solder tails of the contact onto the printed circuit board and, when necessary, fixing the supporting part onto the printed circuit board. When a module is to be fitted into the connector, first, the front side of the module is inserted towards the contact to make the conductive pad come into contact with the contact, and the metallic cover is put, from above the module, over the connector body, and the metallic cover is engaged to the connector body. As a result, the module will be sandwiched between the supporting member and the metallic cover and held in the connection position. To disconnect the module from the connector, engagement of the metallic cover to the connector body is released. Then the module can be withdrawn from the connector body.

In this case, even if the connector is subjected to thermal load from the semiconductor chip, as the connector body is reinforced by the metallic cover and as the thermal load to the connector body is reduced by the heat-dissipating effect of the metallic cover, the connector body will be hardly deformed. Furthermore, as the retaining structure is designed to sandwich the module between the metallic cover and the supporting part, even if the connector is subjected to thermal loads, the retaining force for the module will be hardly affected. Thus the connector can retain the module reliably. Moreover, as the connector body has no parts that are subjected to elastic deformation by manipulation, the connector body will not be damaged. Thus the module can be retained in the connection position reliably. Accordingly, even if the heat generation of semiconductor chip of the module increases significantly, defective connection and disconnection of the module can be prevented reliably. As the metallic cover covers the conductive parts, etc. of the connector body and the module, the cover exhibits its shielding function. Accordingly, the effects of electromagnetic waves or the like on the connector for module will be reduced, and stable operation of the circuit can be maintained. Such a conductive part includes both conductor and semiconductor.

When the metallic cover is engaged to the connector body, the heat sink will come into contact with the semiconductor chip. At the time, if the heat sink receives a reaction from the module, the supporting structure will change the angle of fitting the heat sink to the metallic cover so that the contacting surface of the heat sink will align with the surface of the semiconductor chip. Accordingly, irrespective of the degree of parallelism between the metallic cover and the module, the contacting surface of the heat sink will reliably make face-to-face contact with the surface of the semiconductor chip. This ensures efficient transfer of heat from the semiconductor chip to the heat sink, and the semiconductor chip will be cooled well and their stable operation will be maintained. Moreover, as the heat sink covers the conductive parts, etc. of the module, the heat sink will exhibit shielding function. As a result, effects of electromagnetic waves or the like on the module will be reduced and the stable operation of the circuit can be maintained.

BRIEF DESCRIPTION OF THE DRAWINGS

FIG. 18A is a perspective view showing a male member and a female member are separated from each other. FIG. 18B is a perspective view showing the male member and the female member are connected with each other.

FIG. 36A is a perspective view, and FIG. 36B is a magnified view showing a protrusion and a guide groove thereof.

FIG. 37A and FIG. 37B show that the metallic cover is engaged to the connector body of the seventh embodiment of the connector. FIG. 37A is a perspective view, and FIG. 37B is a magnified view showing a protrusion and a guide groove thereof.

PREFERRED EMBODIMENTS OF THE INVENTION

Figure 1:
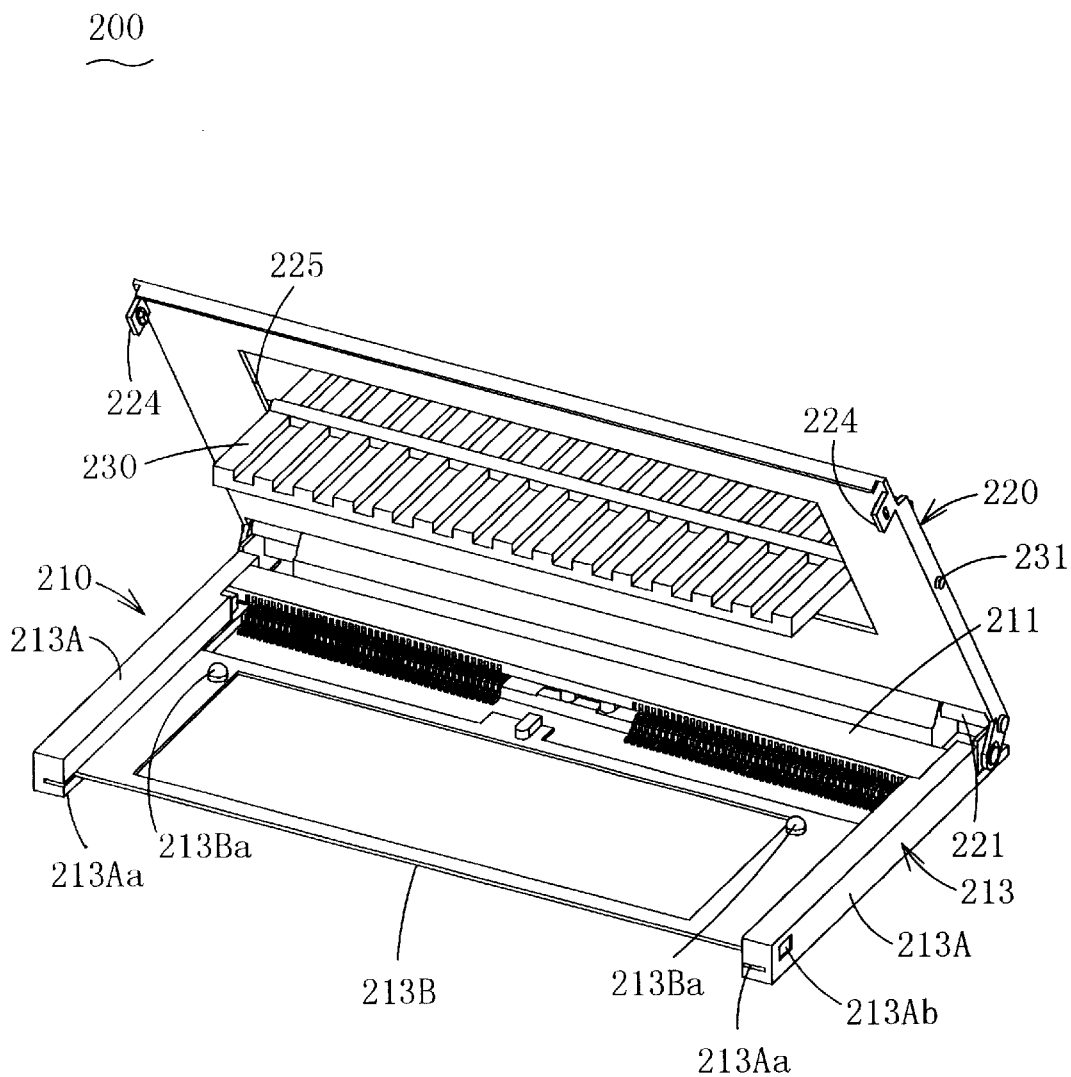
FIG. 1 is a perspective view showing the first embodiment of the connector.

In the following, some embodiments of the connector for module according to the present invention will be described. Each embodiment will be described by using a system of directions that is based on the directions to the front, to the rear, to the left, to the right, to the top, and to the bottom, respectively. This system of directions is used only for the connector just to facilitate the description. The system of directions is not related to the actual directions of the printed circuit board on which the connector is mounted and the device in which the printed circuit board is stored.

FIG. 1 through FIG. 9B show the first embodiment. In these diagrams, 100 denotes a module, and this module 100 is provided with a rectangular board 110, on which semiconductor chips 120 such as semiconductor memories are mounted, and conductive pads 130, which are connected to the above-mentioned semiconductor chips 120, etc., are provided on the front side 111 of the board 110. The conductive pads 130 are made of conductors and are provided on the face and the back of the board 110. In addition to this, the present invention covers a module wherein conductive pads are provided only on the face of the front side of the board, and a module wherein conductive pads are provided only on the back of the front side of the board. Inwardly concave notches 115 are formed in the left side 112 and the right side 113 of the module 100. Positioning holes 116 are formed through on the left and on the right of the center of the module 100. For the convenience of description, the marks that are used for the front side, side faces, bottom, etc. of the board 110 are also used for the front side, side faces, bottom, etc. of the module 100.

Figure 9A:
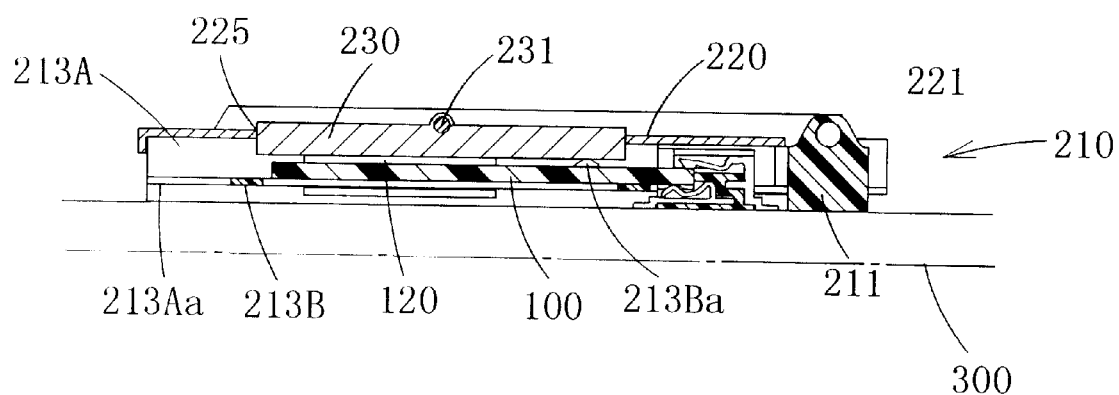
FIG. 9A is a vertical sectional view showing the rear end of the metallic cover of the first embodiment of the connector is lowered and engaged to the connector body.
Figure 9B:
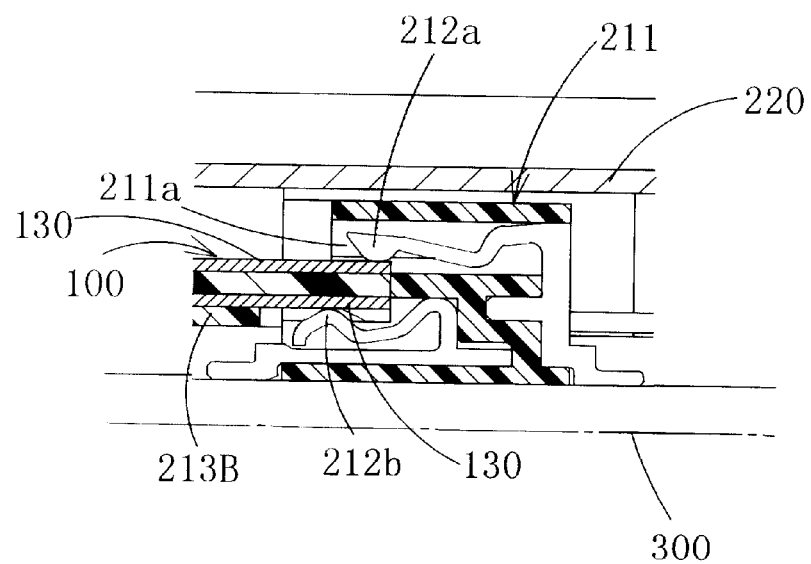
FIG. 9B is a partially magnified view thereof.
Figure 10:
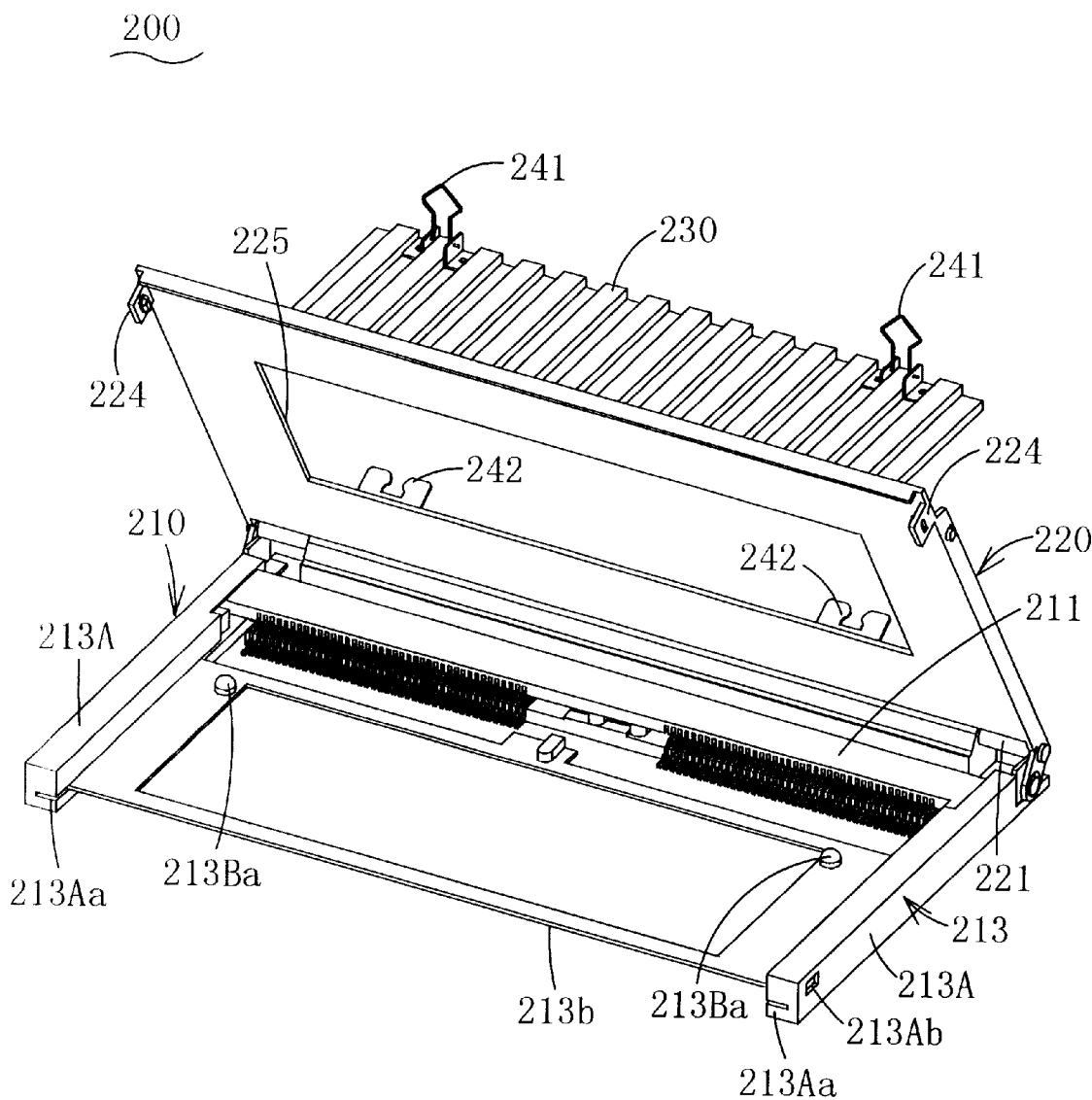
FIG. 10 is a perspective view of the second embodiment of the connector.
Figure 11:
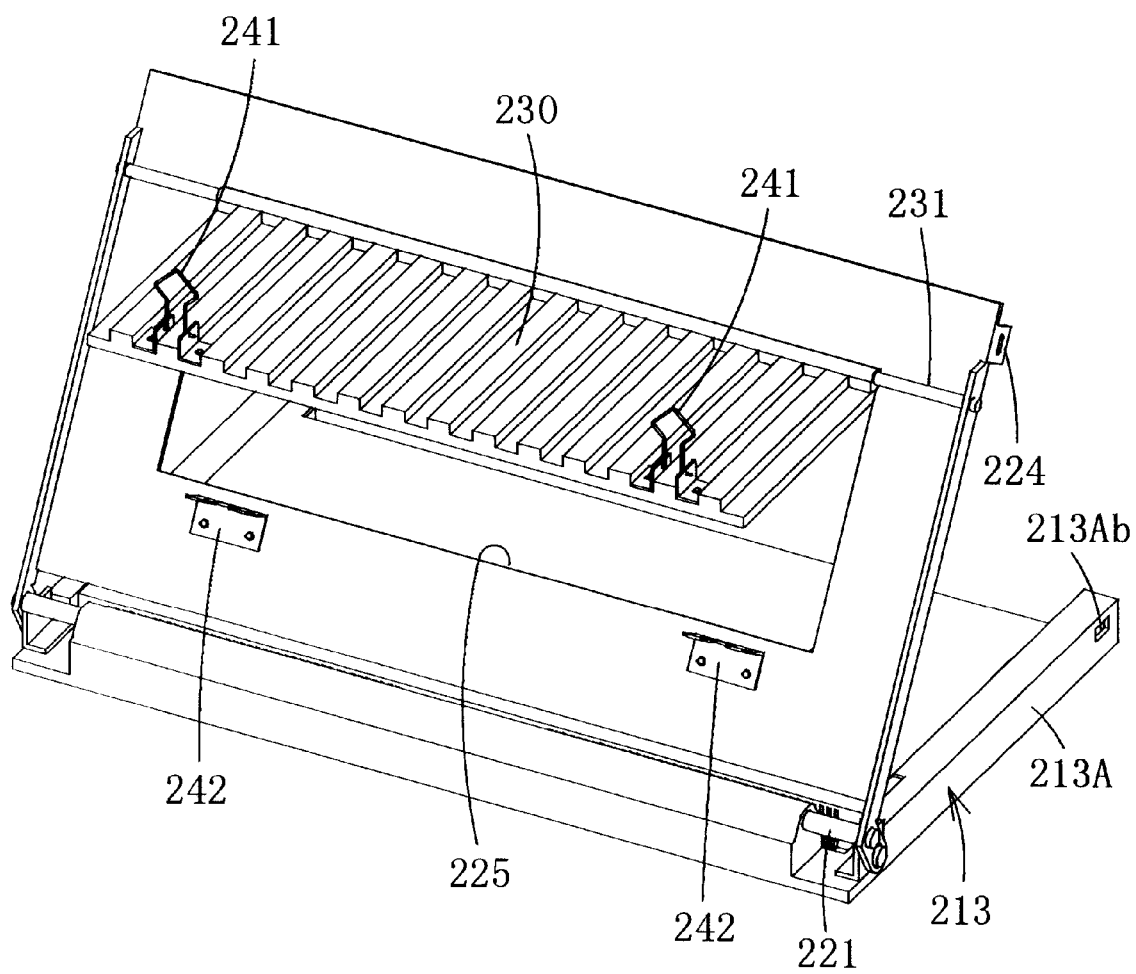
FIG. 11 is a perspective view of the second embodiment of the connector seen in a direction opposite to that of FIG. 10.
Figure 12:
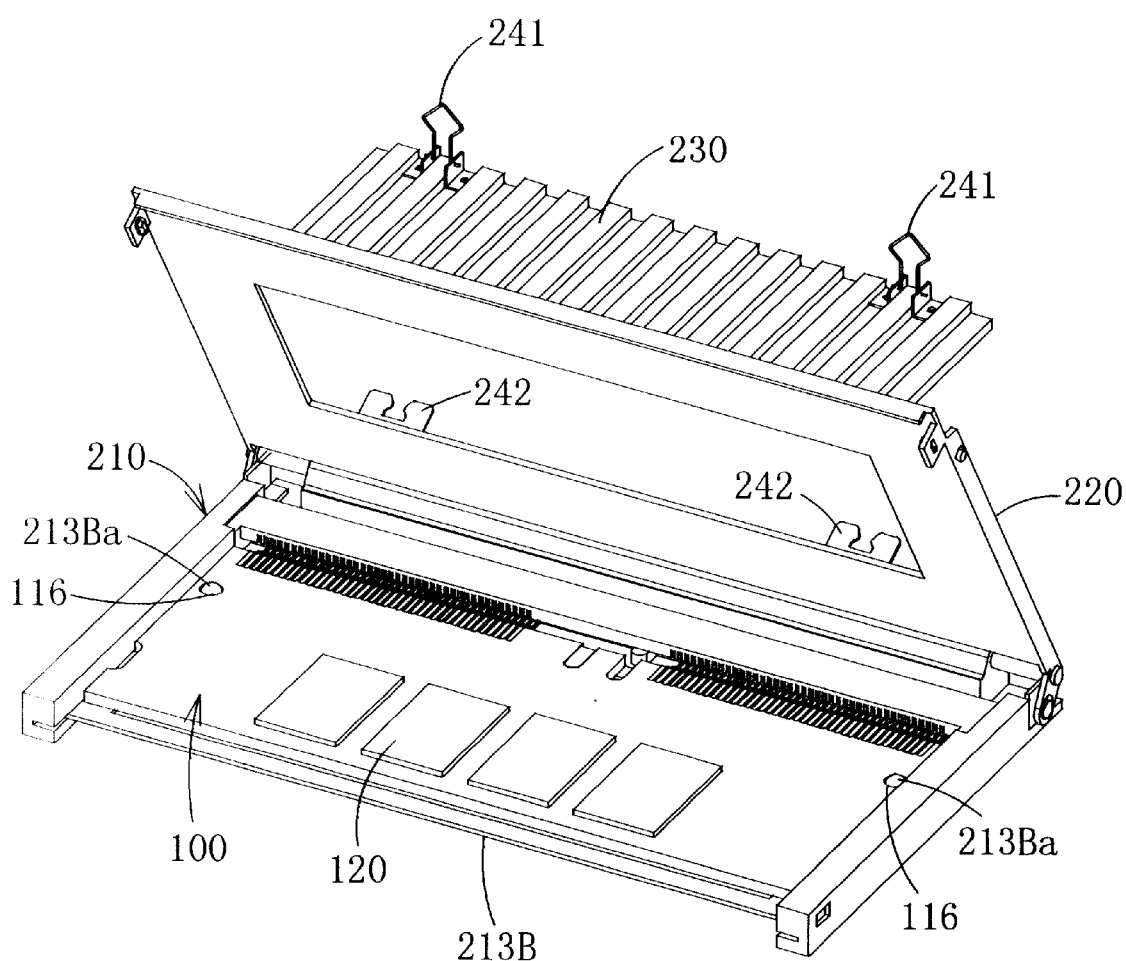
FIG. 12 is a perspective view showing the module is placed on the slider of the second embodiment of the connector.
Figure 13:
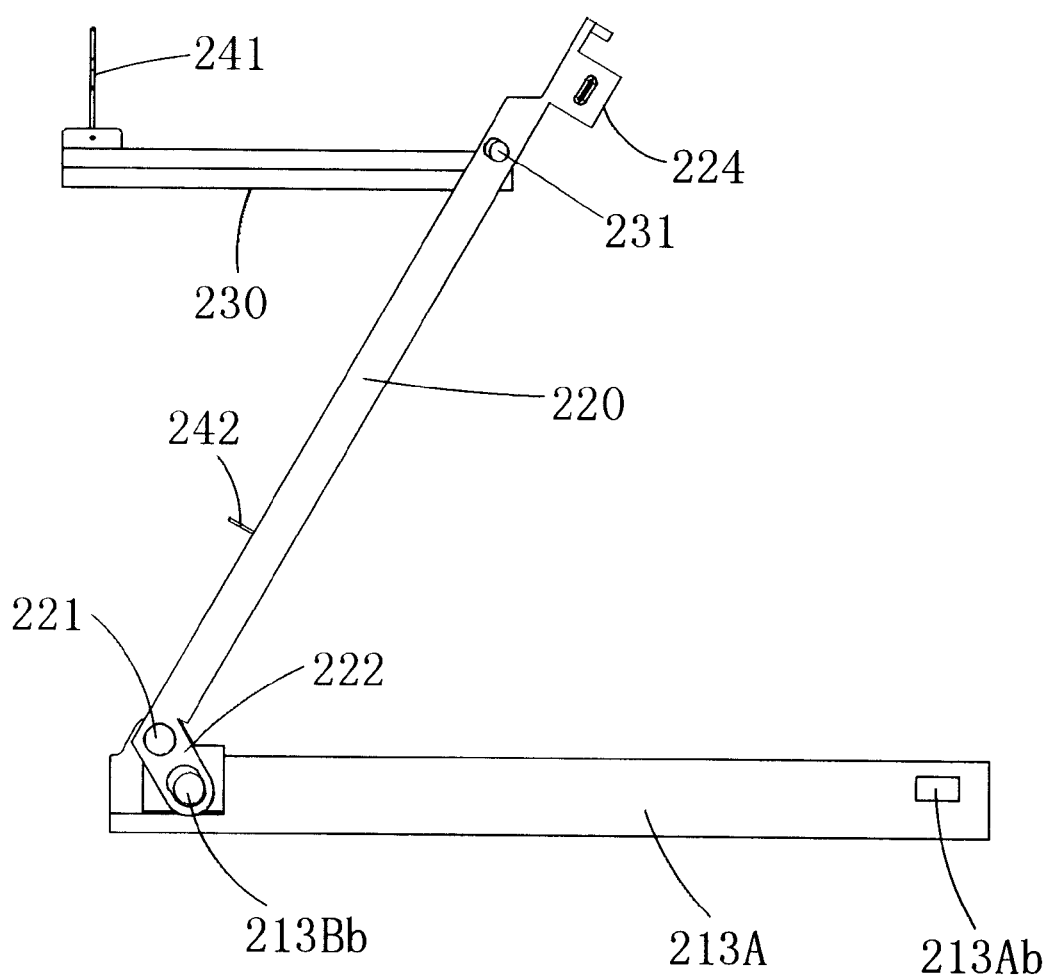
FIG. 13 is a side view showing the module is placed on the slider of the second embodiment of the connector.
Figure 14:
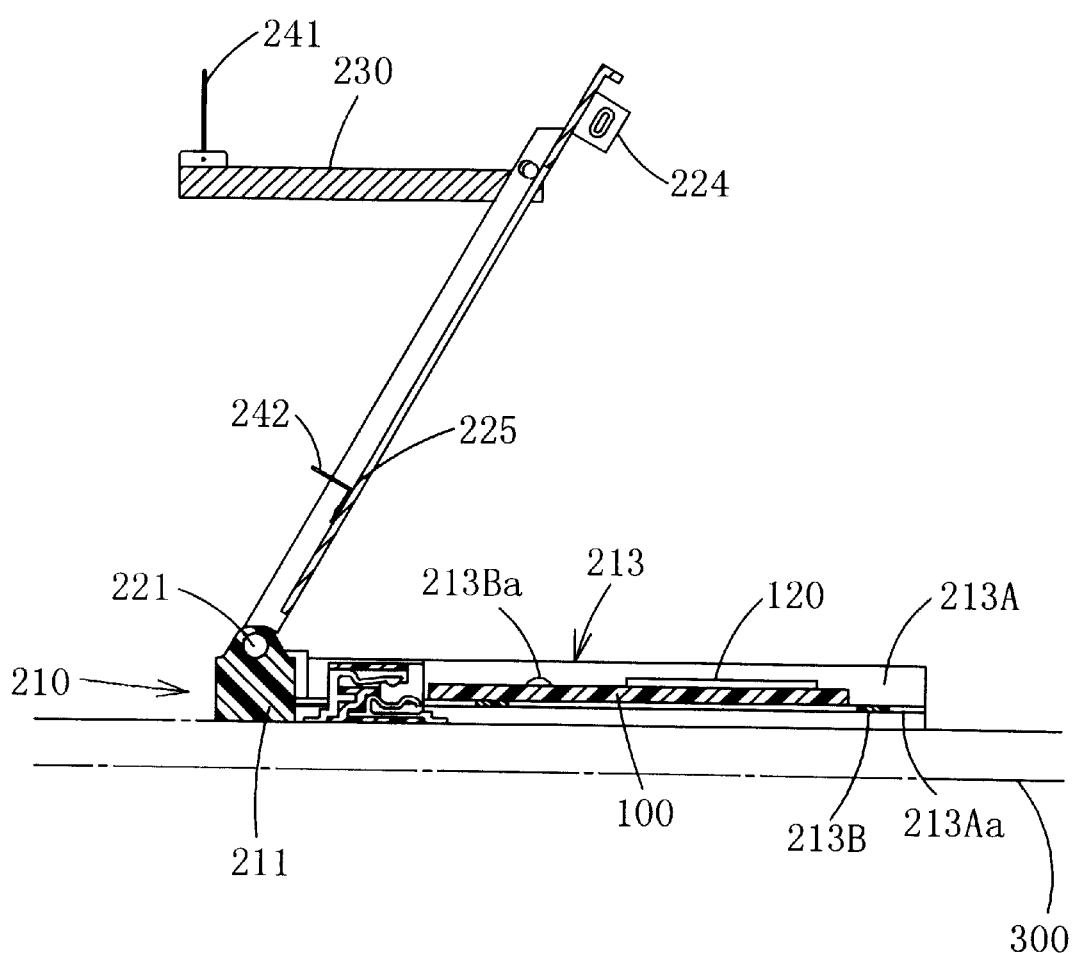
FIG. 14 is a vertical sectional view showing the module is placed on the slider of the second embodiment of the connector.
Figure 15:
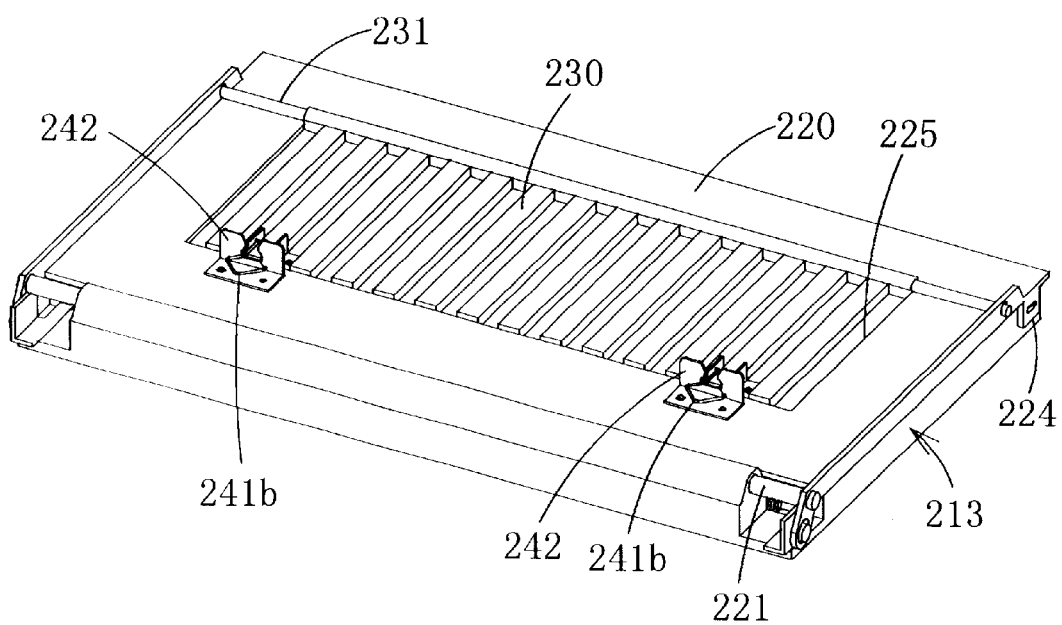
FIG. 15 is a perspective view showing the rear end of the metallic cover is lowered and engaged to the connector body of the second embodiment of the connector.
Figure 16:
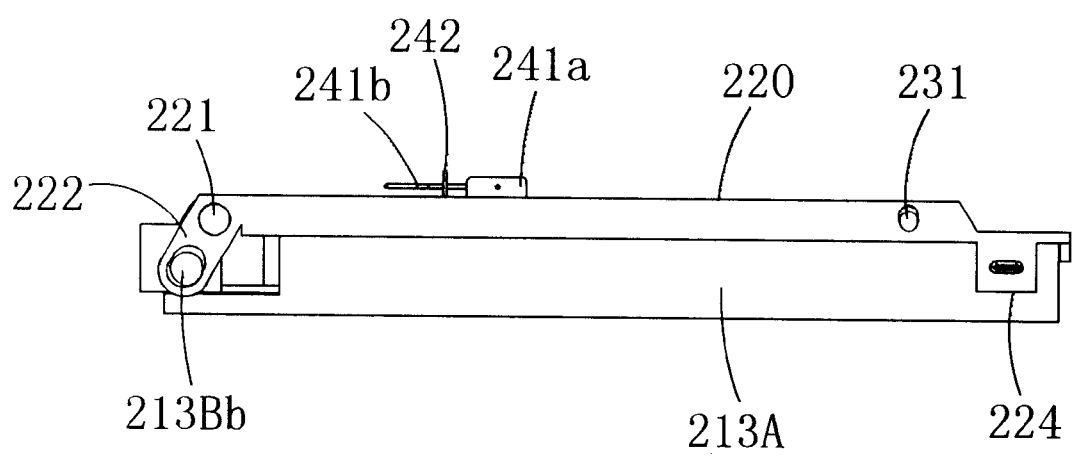
FIG. 16 is a side view showing the rear end of the metallic cover is lowered and engaged to the connector body of the second embodiment of the connector.
Figure 17:
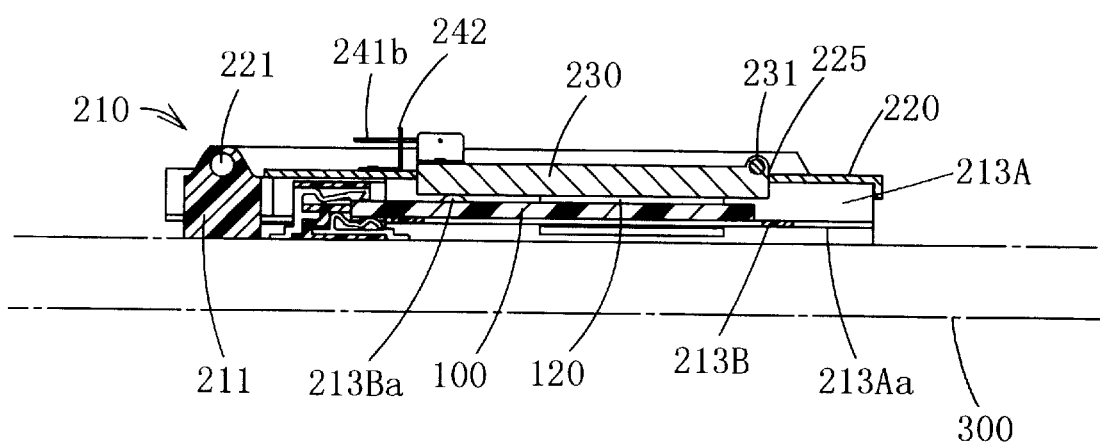
FIG. 17 is a vertical sectional view showing the rear end of the metallic cover is lowered and engaged to the connector body of the second embodiment of the connector.

200 denotes a connector for module that connects the above-mentioned module 100 to a printed circuit board 300 such as a mother board. As shown in FIG. 9A and FIG. 9B, the module 100 is fitted in the connector 200 in a position in which the plane of the module 100 is approximately parallel to the printed circuit board 300. This position of the module 100 is called the connection position. The position when the module is being directed to the connection position is called the insertion position, and the position when the module is being shifted from the connection position is called the withdrawal position. The connector 200 is provided with a connector body 210. This connector body 210 has a receiving part 211 that extends along the front side 111 of the module 100 being in the connection position, and a supporting part 213 that extends rearward from the receiving part 211 to carry the module 100 being in the connection position while limiting shift of the module in the front-rear direction and the left-right direction.

Figure 6A:
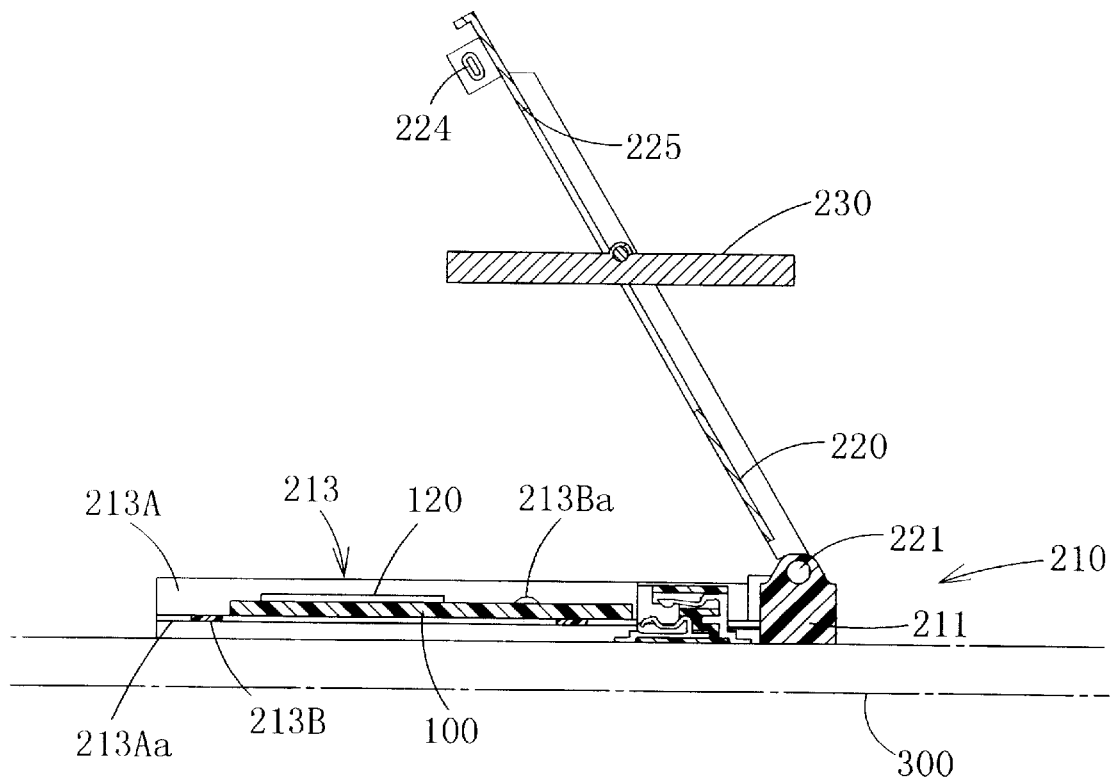
FIG. 6A is a vertical sectional view showing the module is placed on the slider of the first embodiment of the connector.
Figure 6B:
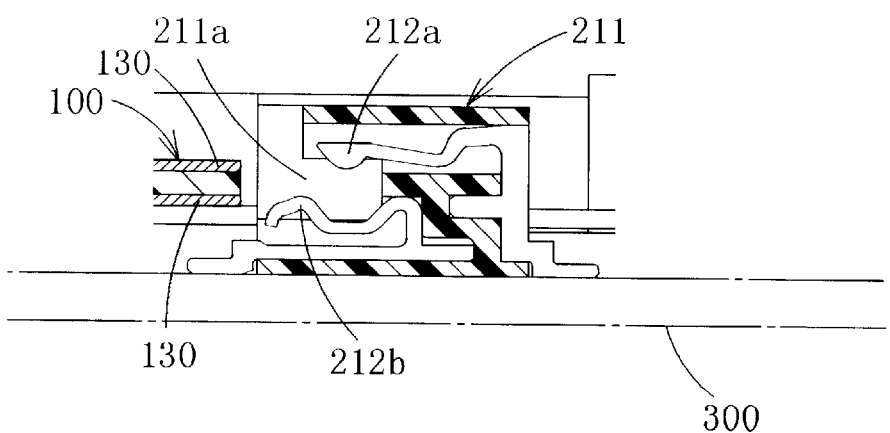
FIG. 6B is a partially magnified view thereof.
Figure 7:
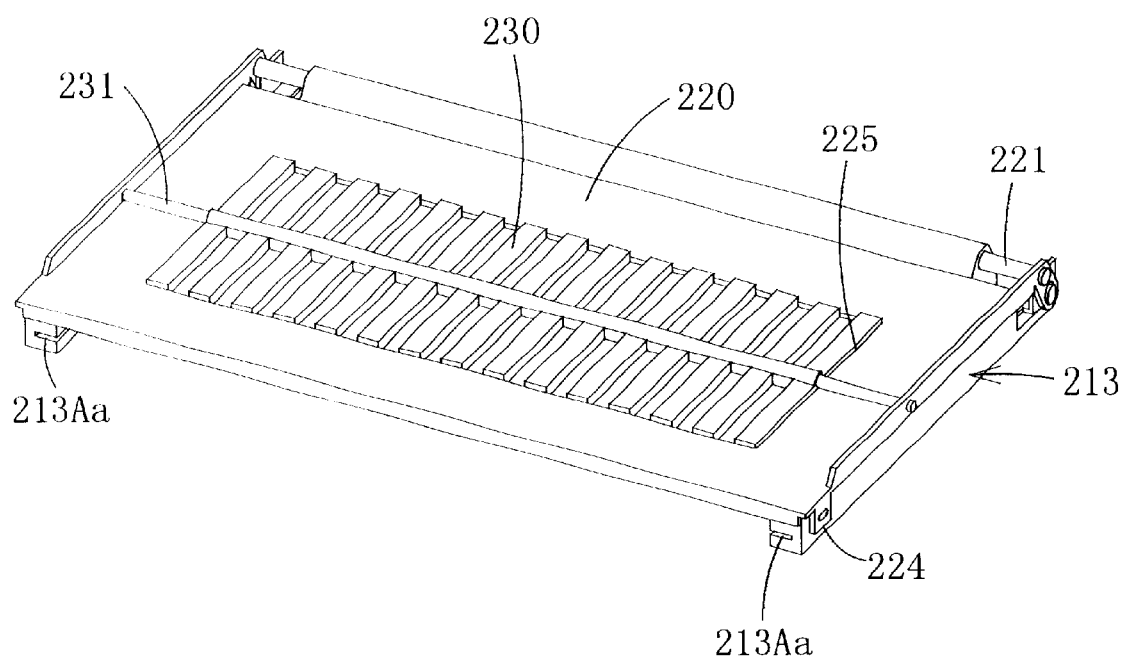
FIG. 7 is a perspective view showing the rear end of the metallic cover is lowered and engaged to the connector body of the first embodiment of the connector.
Figure 8:
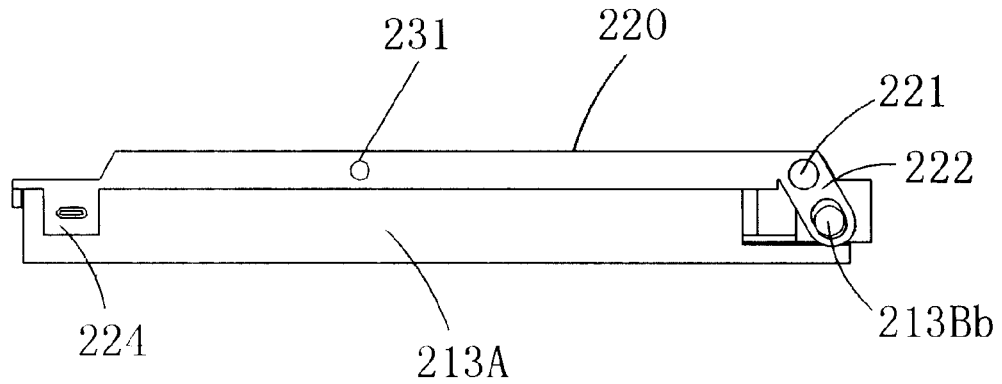
FIG. 8 is a side view showing the rear end of the metallic cover is lowered and engaged to the connector body of the first embodiment of the connector.

As shown in FIG. 6B, the receiving part 211 is provided with contacts 212a, 212b. In this embodiment, the rear of the receiving part 211 is provided with a groove 211a into which the front side 111 of the module 100 is to be inserted. This groove 211a is provided with contacts 212a, 212b, which contact the conductive pads 130 on both faces in the thickness direction of the board 110 while allowing the module 100 to shift in a direction of insertion/withdrawal thereof. The contacts 212a, 212b are arranged on an upper side and a lower side in the groove 211a to oppose to each other. For a module wherein conductive pads are provided only on the face of the front side of the board, contacts may be provided only on the upper side. For a module wherein conductive pads are provided only on the back of the front side of the board, contacts may be provided only on the lower side.

Figure 2:
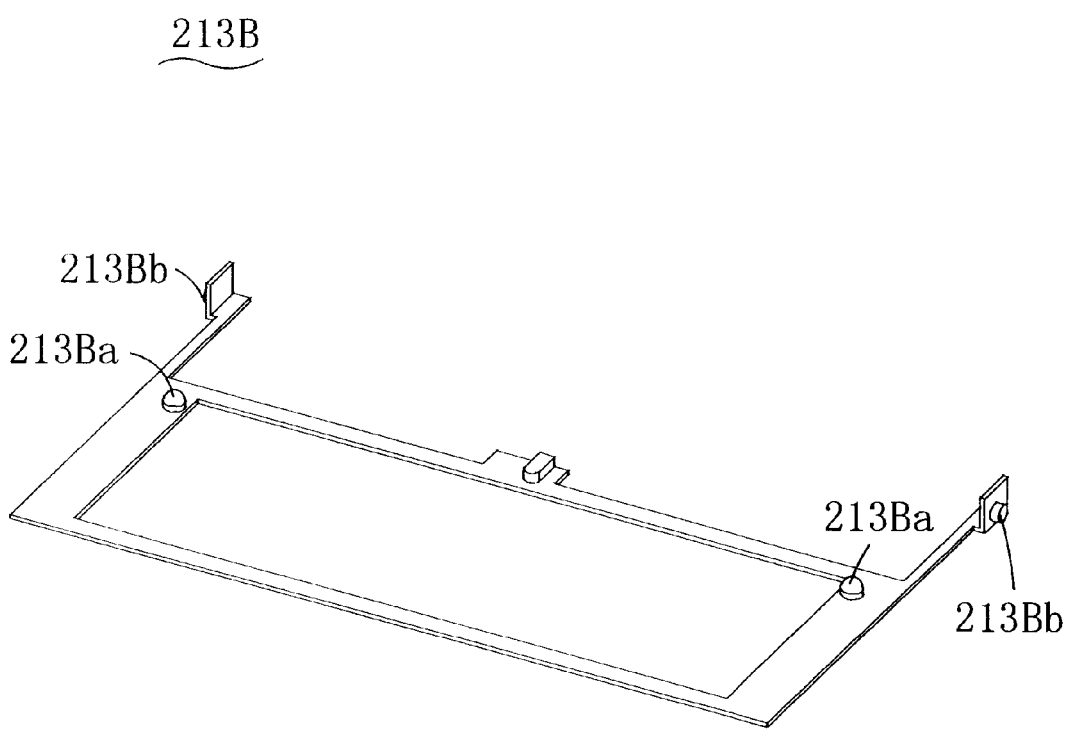
FIG. 2 is a perspective view of a slider.
Figure 3:
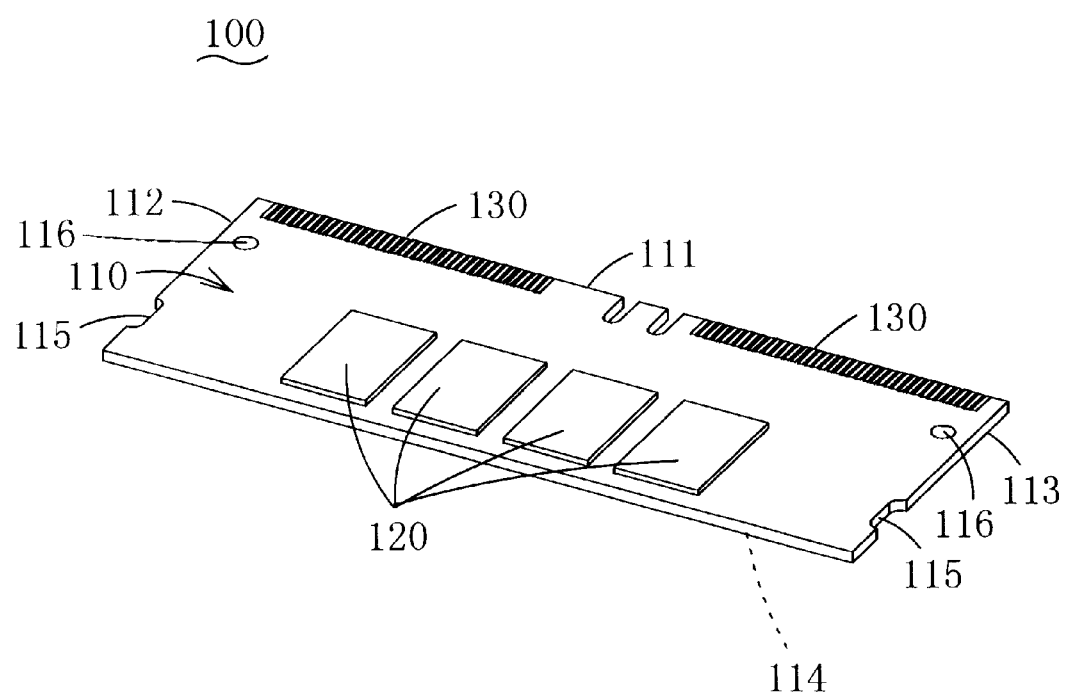
FIG. 3 is a perspective view of a module.
Figure 4:
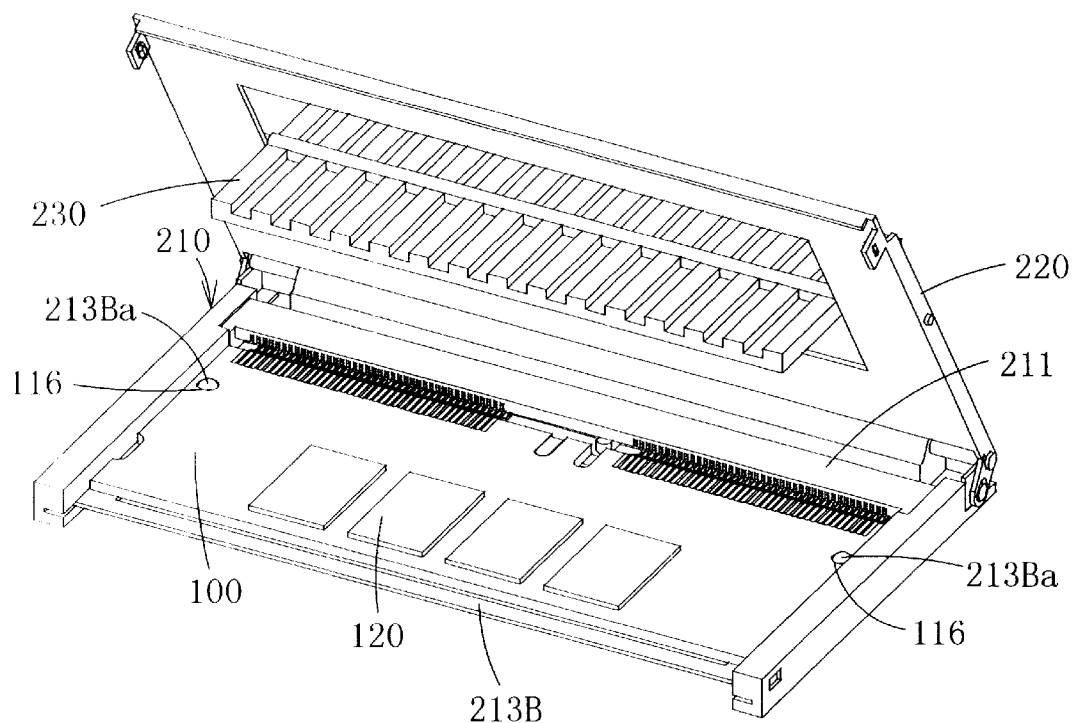
FIG. 4 is a perspective view showing the module is placed on the slider of the first embodiment of the connector.
Figure 5:
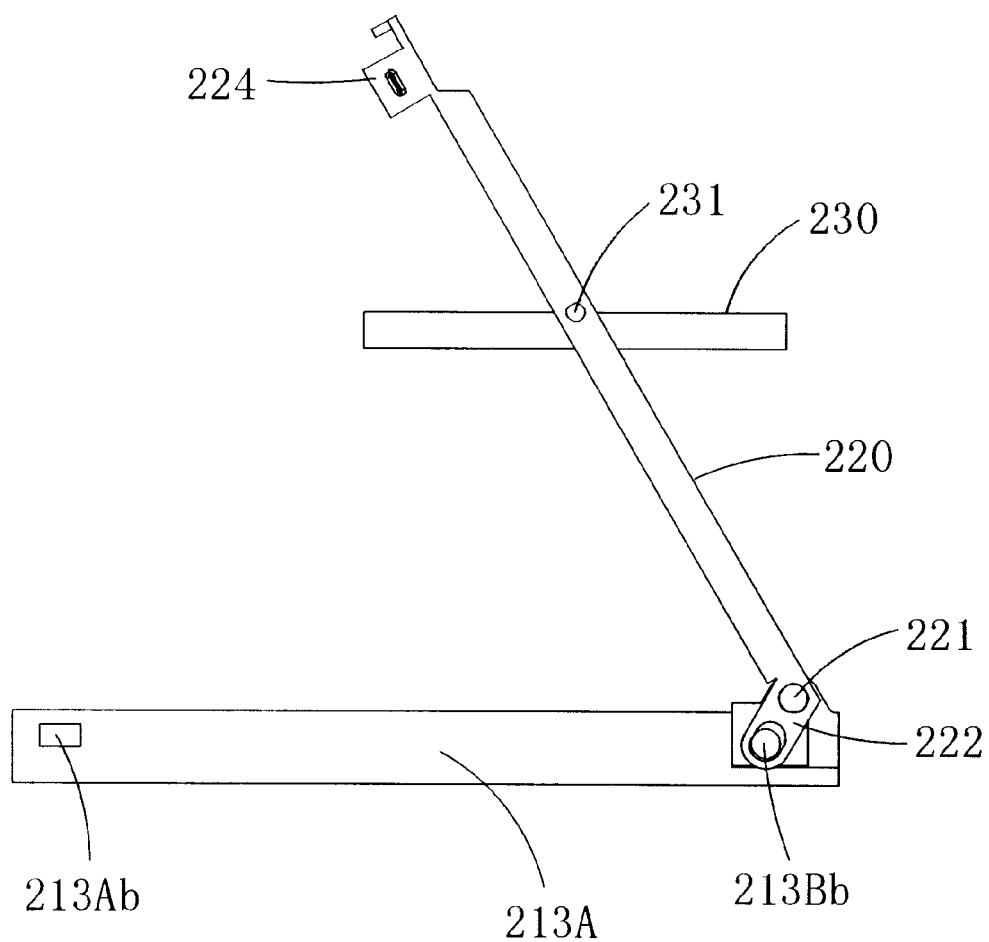
FIG. 5 is a side view showing the module is placed on the slider of the first embodiment of the connector.

The supporting part 213 is provided with two bases 213A, one on the left and one on the right, and a plate-like slider 213B that is supported by the bases 213A so that the slider 213B is at a height of the space between the contacts 212a, 212b and is approximately parallel to the printed circuit board 300. The bases 213A extend rearward along the left side and the right side of the module 100 being in the connection position. A guide groove 213Aa is formed in the inner side of each base 213A in the front-rear direction. The left and right side ends of the slider 213B are fitted into these guide grooves 213Aa, and the slider 213B can slide forward and rearward. As shown in FIG. 2, the slider 213B is to carry the module 100 on its top. Limiting protrusions 213Ba are provided in both the left and the right of the slider 213B, and these limiting protrusions 213Ba are to fit into the positioning holes 116 of the module 100 so as to limit shifting of the module 100 being in the connection position or in the insertion/withdrawal position in the front-rear direction and the left-right direction. Another embodiment of the slider is, for example, one wherein the top central part of the slider is concaved, and the left and right inner walls of the concave part are to receive the left side 112 and the right side 113 of the module 100, the rear wall receives the rear of the module 100, and the contacts 212a, 212b receive the front of the module 100. With this arrangement shifting of the module 100 being in the connection position or in the insertion/withdrawal position is limited in the front-rear direction and the left-right direction. Such a slider is effective when a module that has no positioning holes 116 is to be fitted. The present invention include embodiments having such a slider. Another embodiment of the slider is one wherein protrusions are provided on the top of the slider in the left and the right, and these protrusions are fitted into the notches 115 in the module 100 to limit shifting of the module 100 being in the connection position or in the insertion/withdrawal position in the front-rear direction and the left-right direction. Such a slider is effective when a module that does not have positioning holes 116 but notches 115 is to be fitted. The present invention include embodiments that have such a slider. When necessary, for example, metallic reinforcing tabs (not illustrated) are fixed to the bases 213A, and the reinforcing tabs are fixed onto the printed circuit board 300 by soldering, etc. The present invention includes embodiments wherein the base is not divided into two parts, one on the left and one on the right, but is formed integrally.

This connector 200 is provided with a metallic cover 220. This metallic cover 220 covers the connector body 210 and is engaged to it, and the metallic cover 220 and the supporting part 213 sandwich the module 100 to retain it in the connection position. The metallic cover 220 is hinged to the receiving part 211 at the front, and this allows the metallic cover 220 to lift its rear end. A hinged connection is a connection of two parts in such a way that the two parts can rotate relative to each other around a hinge axis. It includes a form wherein two parts are connected with an actual bar-like hinge axis and a form wherein two parts are connected in such a way that they can rotate relative to each other around a virtual hinge axis. The hinged connection in this embodiment is realized by providing the receiving part 211 with a hinge axis 221 extending in the left-right direction and connecting the metallic cover 220 to this hinge axis 221. The structure for securing the metallic cover 220 to the connector body 210 may take a variety of forms. In this embodiment, securing hooks 224 being small pieces that can be flexed in the left-right direction are formed at the left and the right of the rear end of the metallic cover 220. When the metallic cover 220 is put over the connector body 210, the securing hooks 224 will fit into securing holes 213A*b* that are concaved on the outer sides of the rear ends of the bases 213A. This will secure the metallic cover 220 to the connector body 210.

The metallic cover 220 is connected to the slider 213B in such a way that lifting or lowering of the rear end of the metallic cover 220 makes the slider 213B move forward or backward. Links 222 are fixed in a radial direction of the hinge axis 221 on both the right and left ends of the metallic cover 220, and the top ends of the links 222 are connected to the slider 213B. When the rear end of the metallic cover 220 is up, the slider 213B is in the most withdrawn position (refer to FIG. 4 through FIG. 6B). When the rear end of the metallic cover 220 is lowered, the slider 213B will move forward (refer to FIG. 7 through FIG. 9B). The connection of the links 222 to the slider 213B is realized by, for example, fitting shafts 213B*b* that protrude sidewise from the slider 213B into oblong holes made at the top ends of the links 222. With this structure, when the rear end of the metallic cover 220 is up, the module 100 is placed on the slider 213B, and if the rear end of the metallic cover 220 is lowered, the slider 213B will move forward. Then the front side 111 of the module 100 will enter into the groove 211*a* of the receiving part 211; thus the front side 111 will be inserted into the space between the contacts 212*a*, 212*b*. The conductive pads 130 will contact the contacts 212*a*, 212*b*. If the above-mentioned procedure is reversed, the front side 111 will be withdrawn from the space between the contacts 212*a*, 212*b*. In contrast with the above-mentioned structure, the slider may be provided with the links and the metallic cover may be connected to these links. As for the structure for connecting the metallic cover to the slider in such a way that lifting or lowering of the rear end of the metallic cover makes the slider forward or backward, well-known mechanisms such as rack and pinion can be used, and the present invention include embodiments that use such structures.

A window 225 is opened in the center of the metallic cover 220 to expose semiconductor chips 120 of the module 100 being in the connection position. A heat sink 230 that is to contact the semiconductor chips 120 in the window 225 is connected metallic cover 220 by means of a supporting structure that enables variation of the angle of fitting. The heat sink 230 is a heat-dissipating plate that exhibits excellent heat dissipation. The heat sink 230 may take, for example, a form of a rectangular thick plate of which heat dissipating surface is provided with, when necessary, folds for heat dissipation. To enhance the cooling effect, it is preferable that the surfaces of the semiconductor chips 120 and the contacting surfaces formed on the back of the heat sink 230 are flat. It is more preferable that these surfaces have a high degree of flatness. The supporting structure of the heat sink 230 is a hinge structure. The hinge axis 231 is provided to connect the heat sink 230 and the metallic cover 220 with each other. With this arrangement, the heat sink 230 rotates around the hinge axis 231 relative to the metallic cover 220. As shown in FIG. 6A and FIG. 6B, the hinge axis 231 is parallel to the board 110 of the module 100 being in the connection position and is off the center of gravity of the heat sink 230 in an upward direction. Hence the contacting surface of the heat sink 230 with the semiconductor chips 120 turns downward. The angle of fitting in this context is the angle between the heat sink 230 and the metallic cover 220 with the hinge axis 231 being the center. In this embodiment, the above-mentioned hinge axis 231 is parallel to the front side 111 of the module 100 being in the connection position and to the hinge axis 221 of the metallic cover 220. The present invention includes embodiments wherein the hinge axis 231 is parallel to the board 110 of the module 100 being in the connection position and is located at any point in the front-rear direction of the heat sink 230. The present invention also includes embodiments wherein the window has no rear side on the inner side and is open toward rearward.

The first embodiment of the connector for module is mounted on a printed circuit board 300 by, for example, soldering the solder tails of the contacts 212*a*, 212*b* onto the printed circuit board 300 and, when necessary, fixing the bases 213A of the supporting part 213 on the printed circuit board 300. When a module 100 is to be fitted into the connector 200, the module 100 is placed on the slider 213B when the rear end of the metal cover 220 is up, then the rear end of the metal cover 220 is lowered. As a result, the slider 213B will move forward, and the front side 111 of the module 100 will enter into the groove 211*a* of the receiving part 211 and the front side 111 will be inserted into the space between the contacts 212*a*, 212*b* and the conductive pads 130 will contact the contacts 212*a*, 212*b*. When the metallic cover 220 is put over the module 100 and engaged to the connector body 210, the module 100 will be sandwiched between the supporting part 213 and the metallic cover 220 and kept in the connection position. In this case, the positioning of the module 100 in the top-bottom direction is effected by the metallic cover 220 and the slider 213B, and the positioning of the module 100 in both the front-rear direction and the left-right direction is effected by fitting of the limiting protrusions 213B*a* into the positioning holes 116 of the module 100 to retain the module 100 in the connection position. When the module 100 is to be disconnected from the connector 200, the metal cover 220 is raised. Then engagement to the connector body 210 will be undone and the slider 213B will be retracted and the front side 111 of the module 100 will be withdrawn out of the space between the contacts 212*a*, 212*b*.

In this case, even when the connector 200 is exposed to thermal loads of the semiconductor chips 120, the connector body 210 will be hardly deformed because the connector body 210 is reinforced by the metallic cover 220 and the thermal load to the connector body 210 is reduced by the heat dissipating effect of the metallic cover 220. Moreover, as the retention structure is designed to sandwich the module 100 between the metallic cover 220 and the supporting parts 213, the forces for retaining the module 100 will be hardly affected even if the retention structure is subjected to thermal loads. Thus the module 100 can be retained reliably. Further, as the connector body 210 has no parts that are to be elastically deformed by manipulation, the connector body 210 will not be damaged by manipulation and the module 100 will be kept in the connection position reliably. Accordingly, defective connection and disconnection can be prevented. As the metallic cover 220 covers the conductive members such as the contacts 212a, 212b of the connector body 210 and the conductive pads 130 of the module 100 to exhibit its shielding function. Hence effects of any electromagnetic waves, etc. on the connector 200 will be reduced, and in turn, the operation of the circuits will be maintained stably. When the bases 213A are fixed onto the printed circuit board 300 by means of metallic reinforcing tabs, the metallic cover 220 may be arranged to come into contact with the reinforcing tabs when the metallic cover 220 is engaged to the connector body 210. In this way, a circuit will be completed, which grounds the metallic cover 220 via the reinforcing tabs. This can enhance the shielding performance of the metallic cover 220.

When the metallic cover 220 is engaged to the connector body 210, the heat sink 230 will contact the semiconductor chips 120. As the heat sink 230 will be subjected to a reaction from the module 100 and the angle of fitting to the metallic cover 220 will be changed so that the contacting surface of the heat sink 230 will align the surface of the semiconductor chips 120, the contacting surface of the heat sink 230 will reliably make face-to-face contact with the surfaces of the semiconductor chips 120 irrespective of the parallelism between the metallic cover 220 and the module 100. Hence the heat of the semiconductor chips 120 is efficiently transferred to the heat sink 230 and the semiconductor chips 120 are cooled well and their operation is maintained stably. Furthermore, as the heat sink 230 covers the semiconductor chips 120 and other conductive parts of the module 100, the heat sink 230 will exhibit a shielding function. Hence effects of electromagnetic waves or the like on the module 100 are reduced and the operation of the circuits is maintained stably.

The present invention includes all embodiments wherein the connector body is provided with a metallic cover that is put over and engaged to the connector body from the module side. However, as is the case of the first embodiment, when the metallic cover 220 is hinge-connected, at the front end, to the receiving part 211 and the rear end of the metallic cover 220 is allowed to be lifted, lowering the rear end of the metallic cover 220 will engage the metallic cover 220 to the connector body 210, and lifting the rear end of the metallic cover 220 will release the metallic cover 220 from the connector body 210. Thus engagement and release of the metallic cover 220 can be done easily with a single touch. In the case of this structure, if there is a positional error of the hinge axis 221, the parallelism between the metallic cover 220 and the module 100 when the rear end of the metallic cover 220 is lowered is not good. However, even under such a condition, the contacting surface of the heat sink 230 and the surfaces of the semiconductor chips 120 are corrected by the supporting structure to be parallel to each other. Hence the contacting surface of the heat sink 230 and the surfaces of the semiconductor chips will make face-to-face contact with each other reliably. Hence the heat of the semiconductor chips 120 is transferred to the heat sink 230 efficiently, and the semiconductor chips 120 are cooled well and their operation is maintained stably.

The present invention includes all the embodiments wherein the heat sink is connected to the metallic cover by means of a supporting structure that allows the angle of fitting to change. However, as is the case of the first embodiment, when the supporting structure of the heat sink 230 is a hinge structure wherein the hinge axis 231 is parallel to the board 110 of the module 100 being in the connection position and is off the center of gravity of the heat sink 230, the heat sink 230 will change the angle of fitting to the metallic cover 230 by turning around the hinge axis 231. This supporting structure is simple in structure. Moreover, as the hinge axis 231 is parallel to the board 110 of the module 100 being in the connection position and is off the center of gravity of the heat sink 230 in an upward direction, a moment due to the own weight of the heat sink 230 will work around the center of gravity when the rear end of the metallic cover 220 is raised, and the contacting surface of the heat sink 230 will be supported to be horizontal and turns downward. Accordingly, when the metallic cover 220 is lowered, the contact surface of the heat sink 230 will autonomously contact the surfaces of the semiconductor chips 120; thus manipulability is good.

Figure 18A:
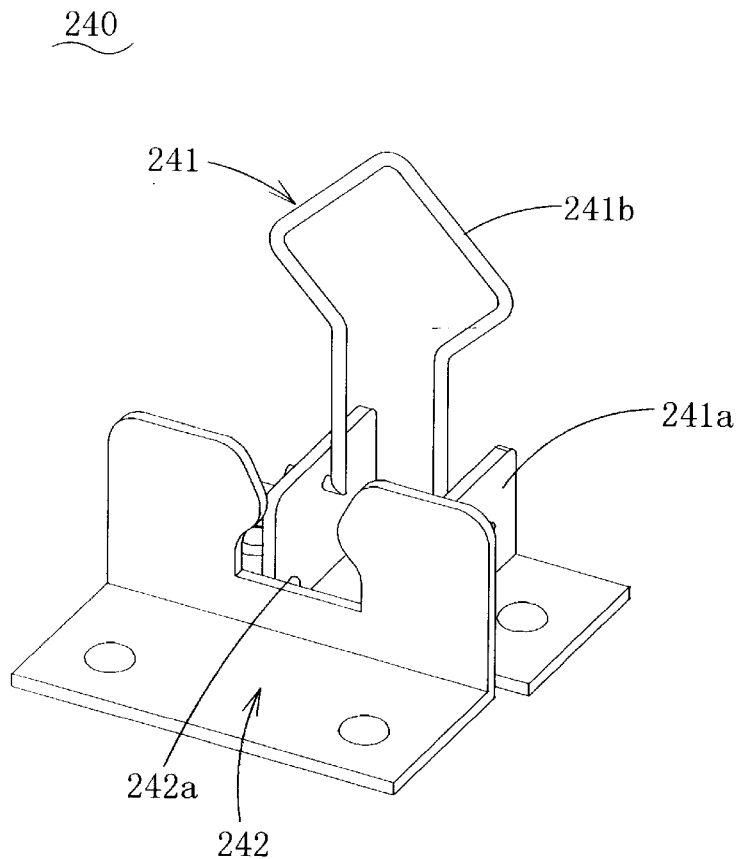
FIG. 18A and FIG. 18B are magnified perspective views of elastic members.
Figure 18B:
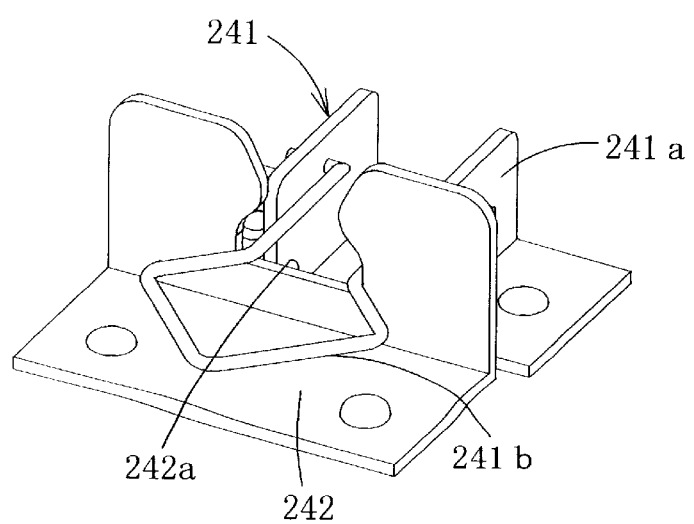

Next, other embodiments will be described. The description of the first embodiment will be cited in tact for other embodiments and only points that differ from the first embodiment will be described in the following. Further, the functions and desirable effects of other embodiments, which have been described for the first embodiment, will not be described repeatedly. FIG. 10 through FIG. 18B show the second embodiment. In this second embodiment, in addition to the supporting structure that enables variation of the angle of fitting the heat sink 230 to the metallic cover 220, elastic members 240 that energize the heat sink 230 towards the module are provided. The above-mentioned supporting structure is a hinge structure having a hinge axis 231 that is parallel to the hinge axis 221 of the metallic cover 220. Thus the heat sink 230 is provided with the hinge axis 231 that extends in the left-right direction, and this hinge axis 231 is connected to the metallic cover 220. The location of the hinge axis 231 may be any location on the heat sink 230 in the front-rear direction thereof, and the diagrams illustrates a form wherein the hinge axis 231 is provided at the rear end of the heat sink 230. The above-mentioned elastic members 240 are provided, as shown in FIG. 18A, with male members 241 and female members 242 that are to be connected to the male members 241. The male member 241 comprises a base 241a and a spring 241b. The spring 241b is approximately U-shaped, and its both ends are rotatably fitted in the base 241a, and the spring 241b widens in the middle. With this arrangement, the spring 241b can rotate in relation to the base 241a. The female member 242 is a small piece and an approximately U-shaped port 242a is formed in the small piece from its top end towards the root end, and the port widens inwardly. Either one of the male member 241 and the female member 242 is provided on the face of the metallic cover 220, and the other is provided on the face of the heat sink 230. The diagrams illustrate a form wherein the male members 241 are fixed on the front end of the face of the heat sink 241 and the female members 242 are fixed on the face of the metallic cover 220, on the front side of the window 225. In this embodiment, as shown in FIG. 18B, when the spring 241b of the male member 241 is toppled and its neck beneath the widened part is fitted into the port 242a of the female member 242, the metallic cover 220 and the heat sink 230 will be connected together elastically by means of the spring 241b. This energizes the heat sink 230 towards the module.

With the arrangement of the second embodiment, as the contacting surface of the heat sink 230 is reliably brought to face-to-face contact with the surfaces of semiconductor chips 120, the heat of the semiconductor chips 120 is efficiently transferred to the heat sink 230. Hence the semiconductor chips 120 are cooled well and their operation is maintained stably. Moreover, as the heat sink 230 is energized towards the module by the elastic members 240, any error in the clearance between the heat sink 230 and the semiconductor chips 120 will be absorbed, and the contacting face of the heat sink 230 will contact the surface of the semiconductor chips 120 with an appropriate pressure. Hence the dispersion of the heat transfer performance from the semiconductor chips 120 to the heat sink 230 among the products can be reduced.

Figure 19:
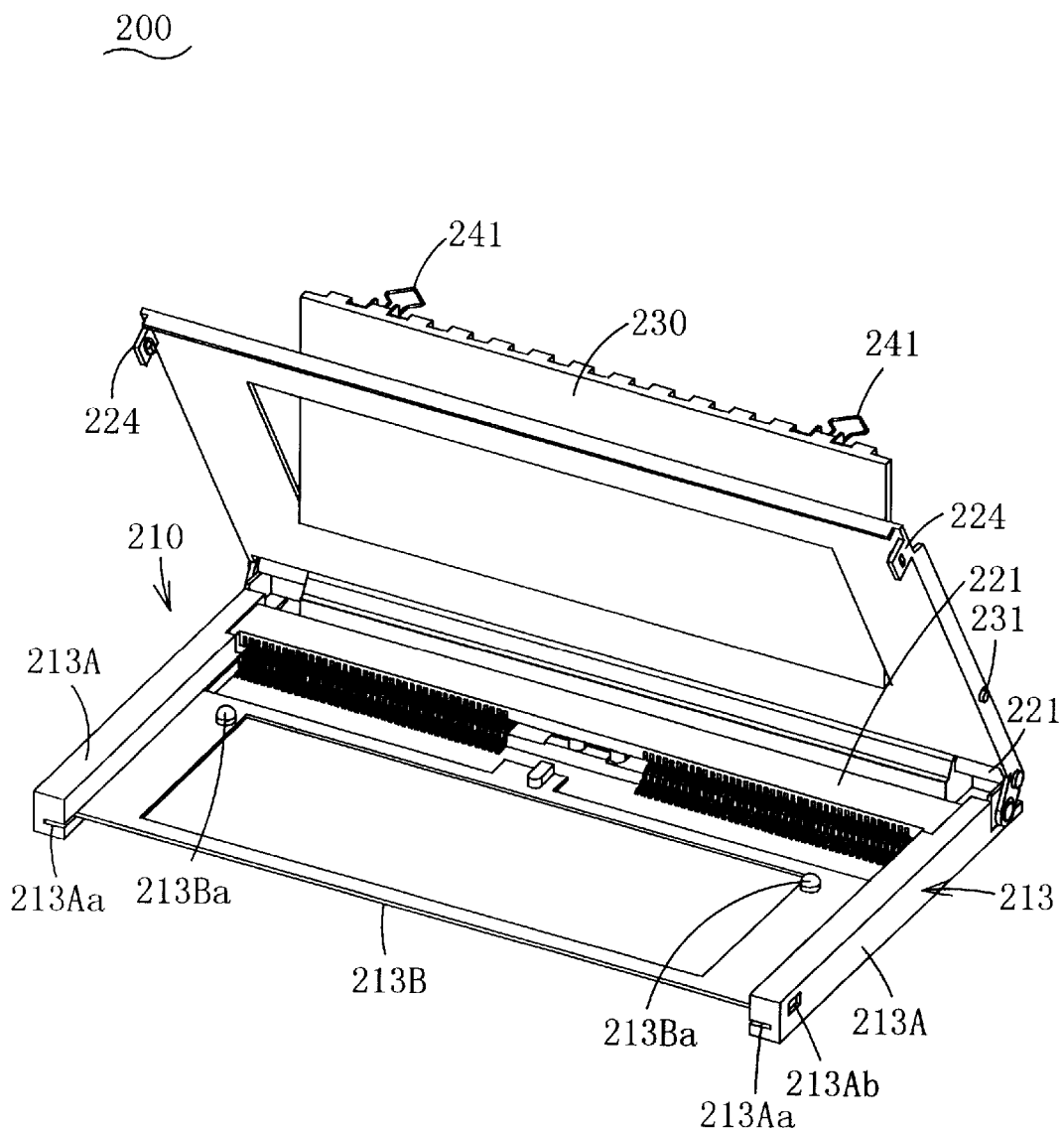
FIG. 19 is a perspective view of the third embodiment of the connector.
Figure 20:
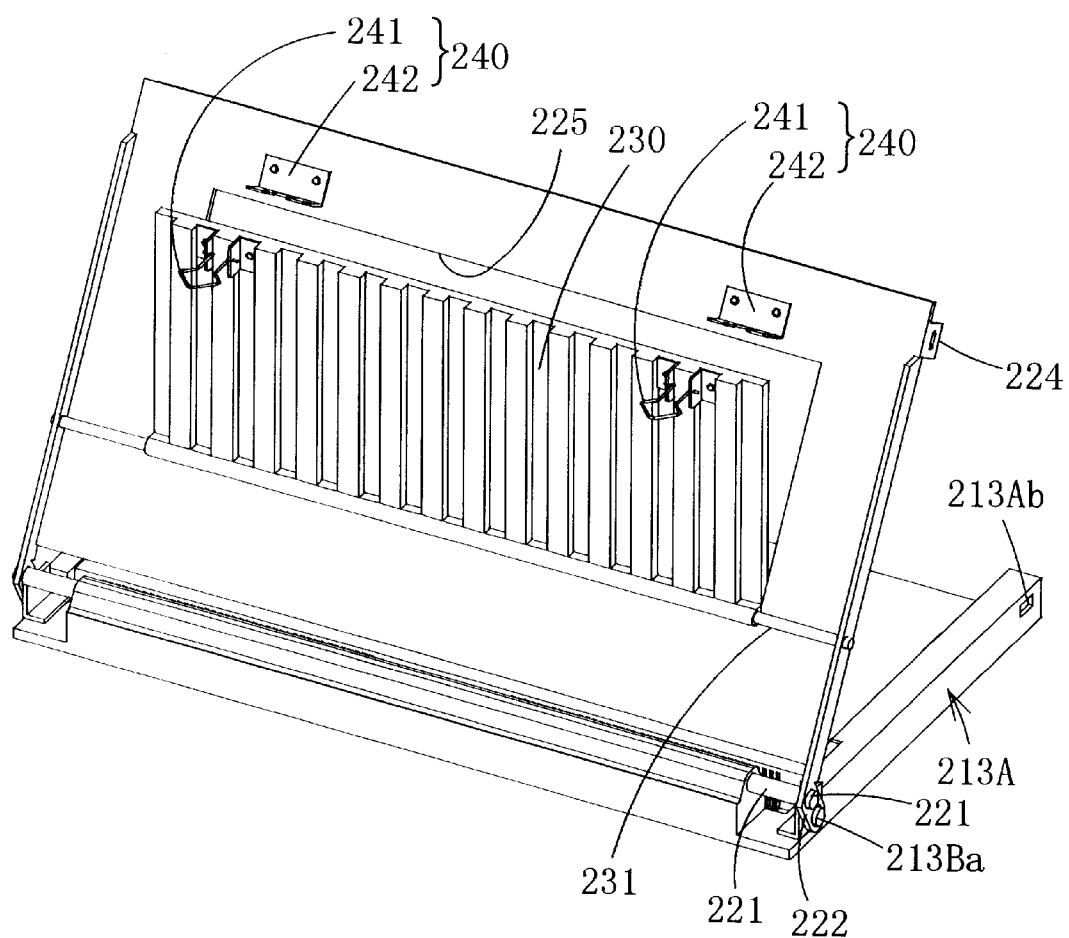
FIG. 20 is a perspective view of the third embodiment of the connector seen in a direction opposite to that of FIG. 19.
Figure 21:
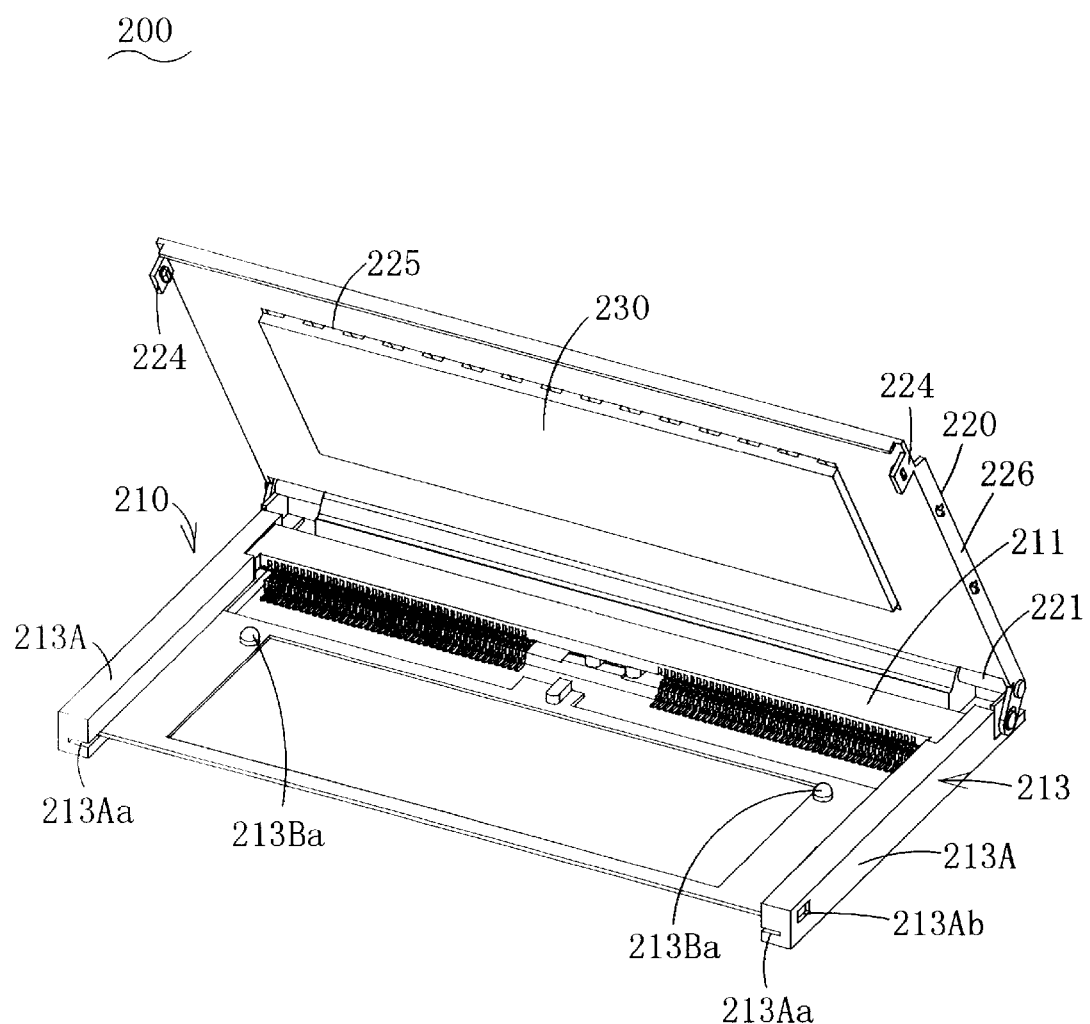
FIG. 21 is a perspective view of the fourth embodiment of the connector.
Figure 22:
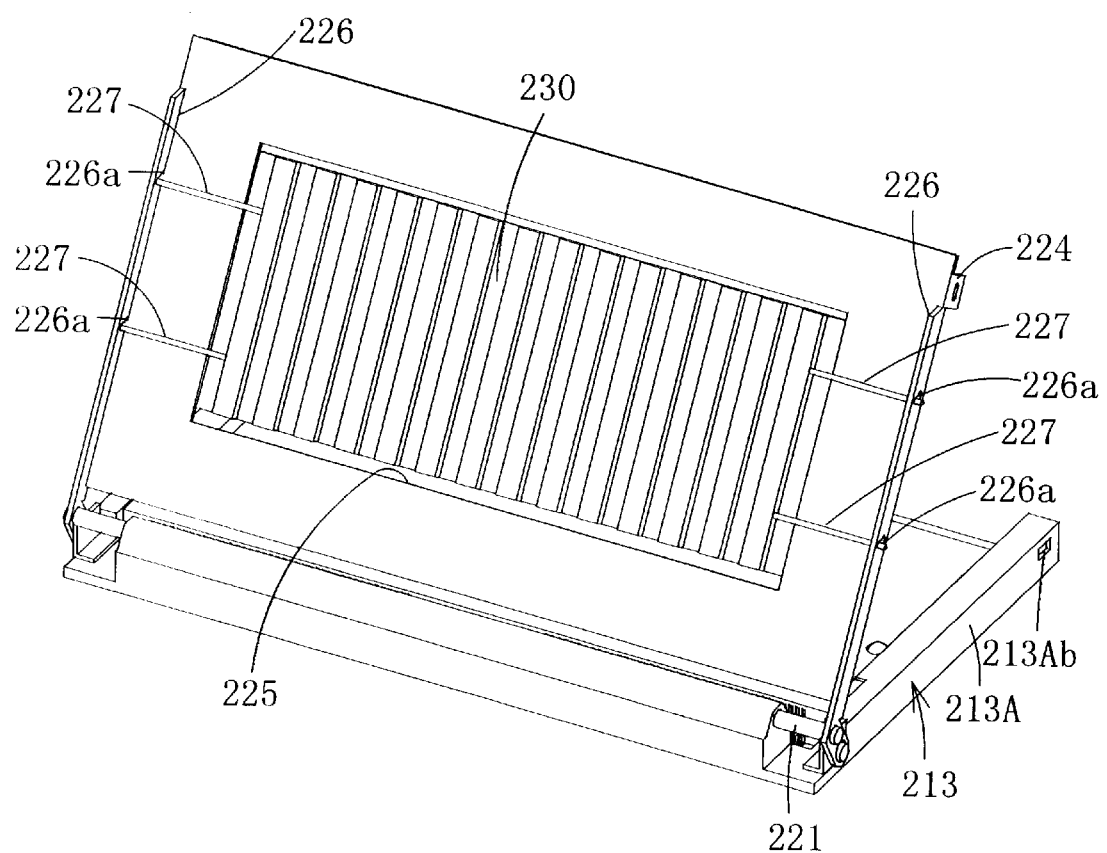
FIG. 22 is a perspective view of the fourth embodiment of the connector seen in a direction opposite to that of FIG. 21.

FIG. 19 and FIG. 20 show the third embodiment. This third embodiment differs from the second embodiment in that the location of the hinge axis 231 is at the front end of the heat sink 230, and that the male members 241 are fixed on the rear end of the face of the heat sink 230 and the female members 242 are fixed on the face of the metallic cover 220, on the rear side of the window 225. The third embodiment, however, is similar to the second embodiment in other aspects as well as the functions and desirable effects.

Figure 23:
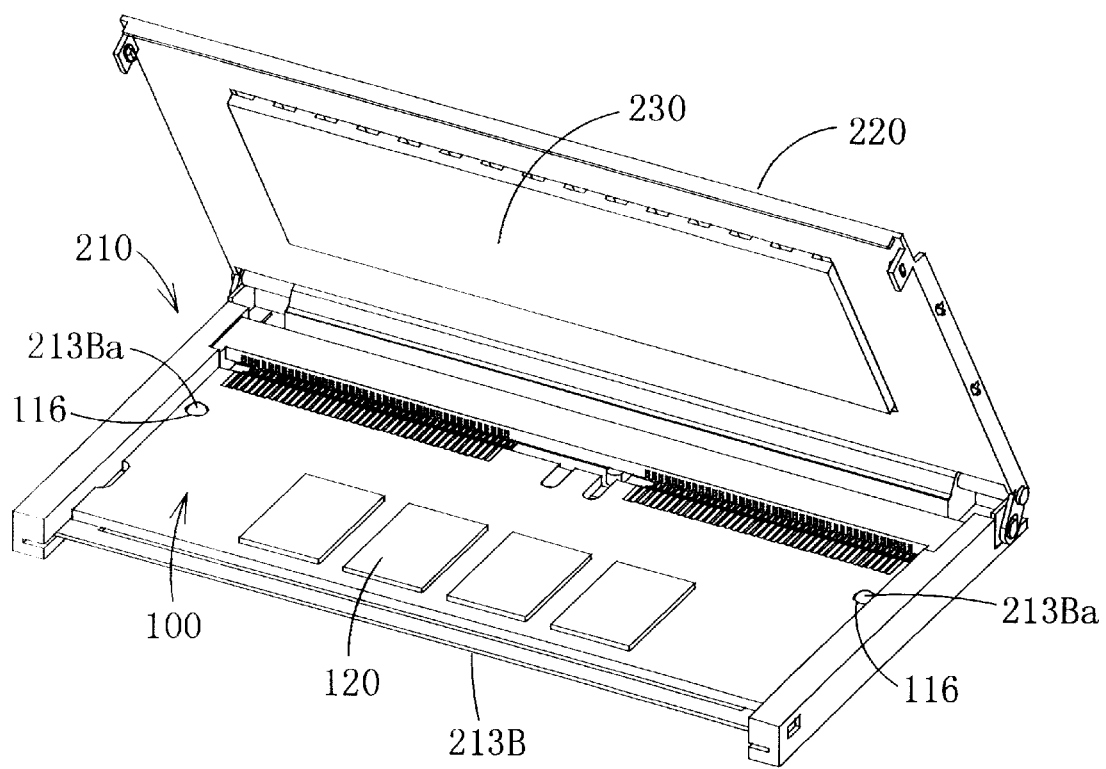
FIG. 23 is a perspective view showing the module is placed on the slider of the fourth embodiment of the connector.
Figure 24A:
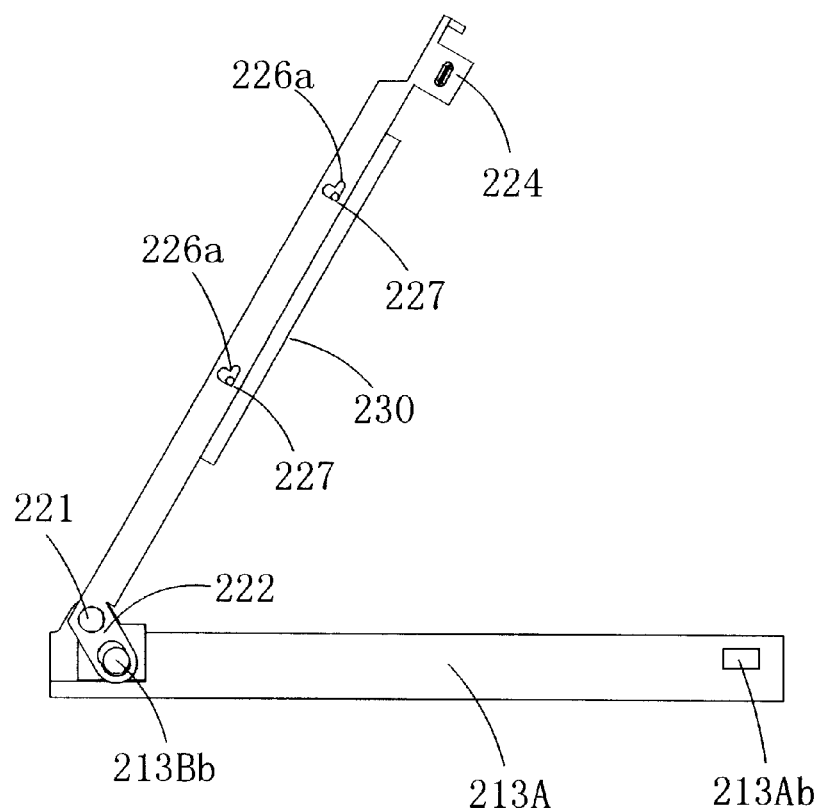
FIG. 24A is a side view showing the module is placed on the slider of the fourth embodiment of the connector.
Figure 24B:
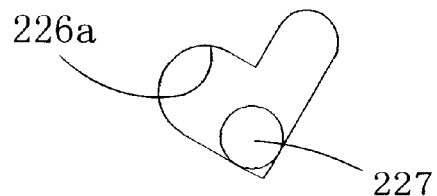
FIG. 24B is a magnified view of the vicinity of the guide hole thereof.
Figure 25:
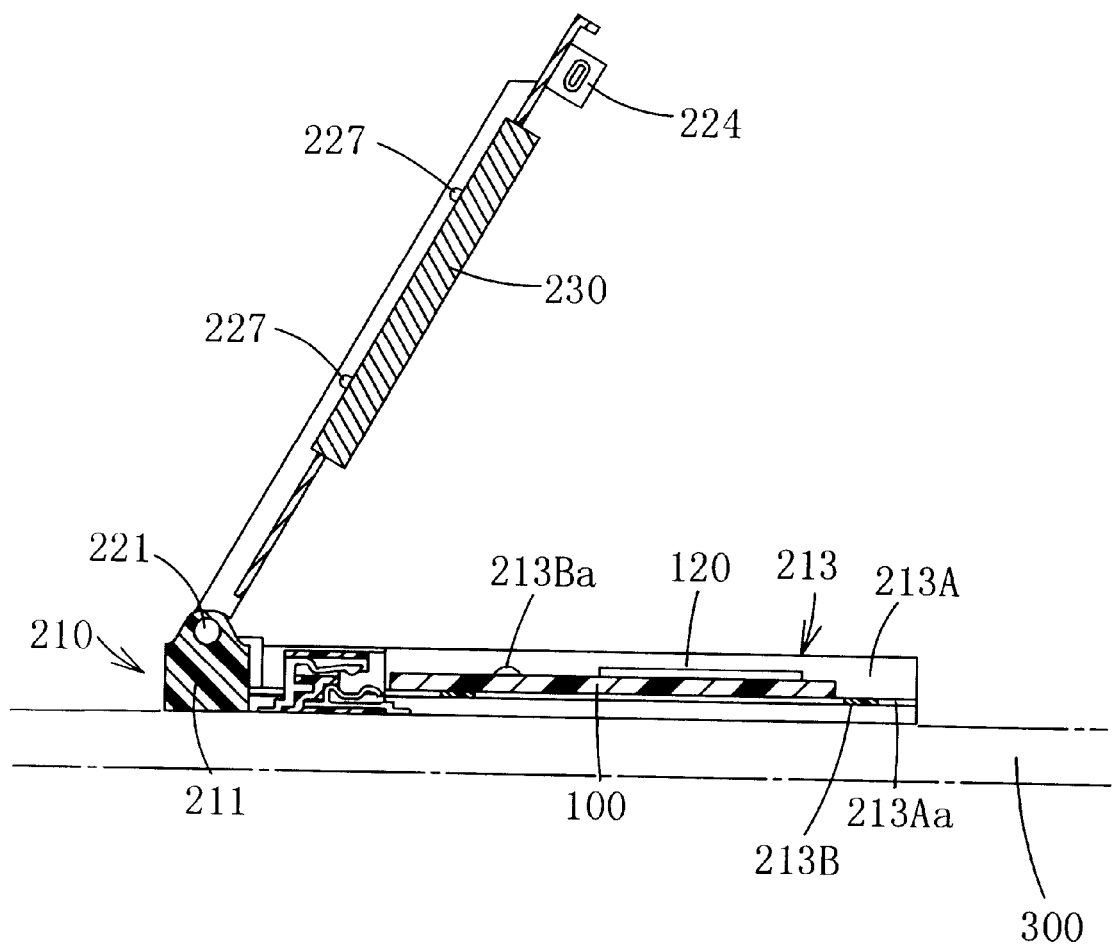
FIG. 25 is a vertical sectional view showing the module is placed on the slider of the fourth embodiment of the connector.
Figure 26:
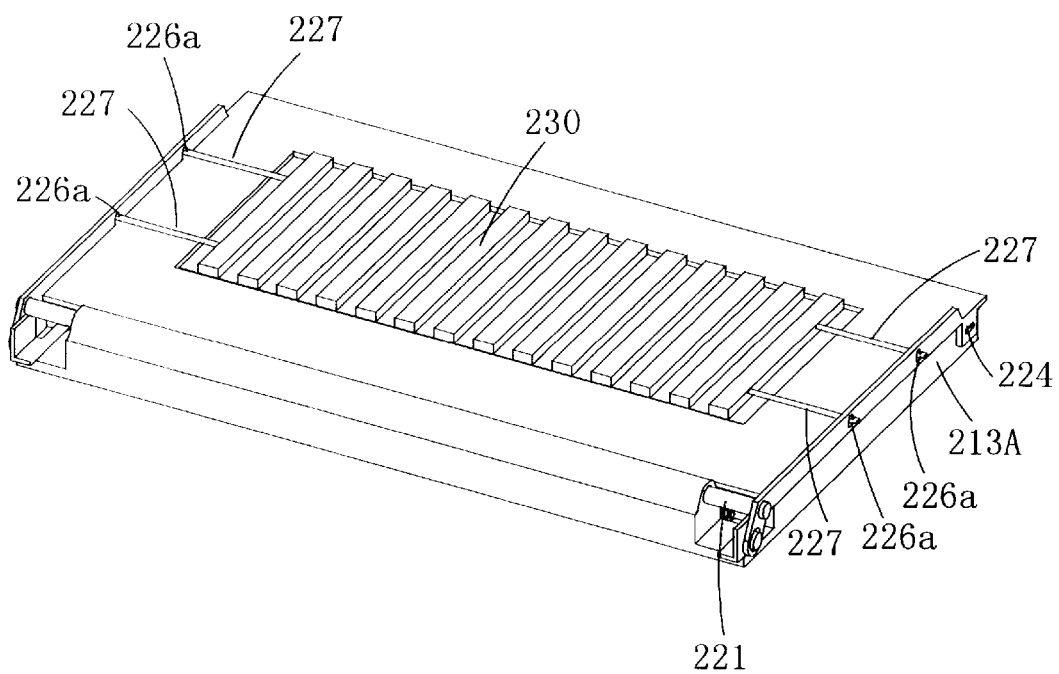
FIG. 26 is a perspective view showing the rear end of the metallic cover is lowered and engaged to the connector body of the fourth embodiment of the connector.
Figure 27A:
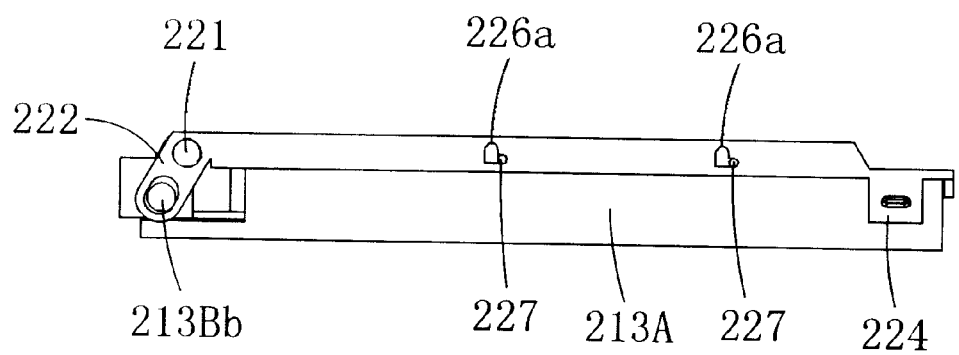
FIG. 27A is a side view showing the rear end of the metallic cover is lowered and engaged to the connector body of the fourth embodiment of the connector.
Figure 27B:
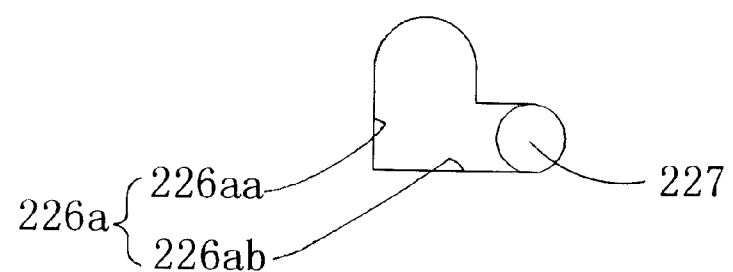
FIG. 27B is a magnified view of the vicinity of the guide hole thereof.
Figure 28:
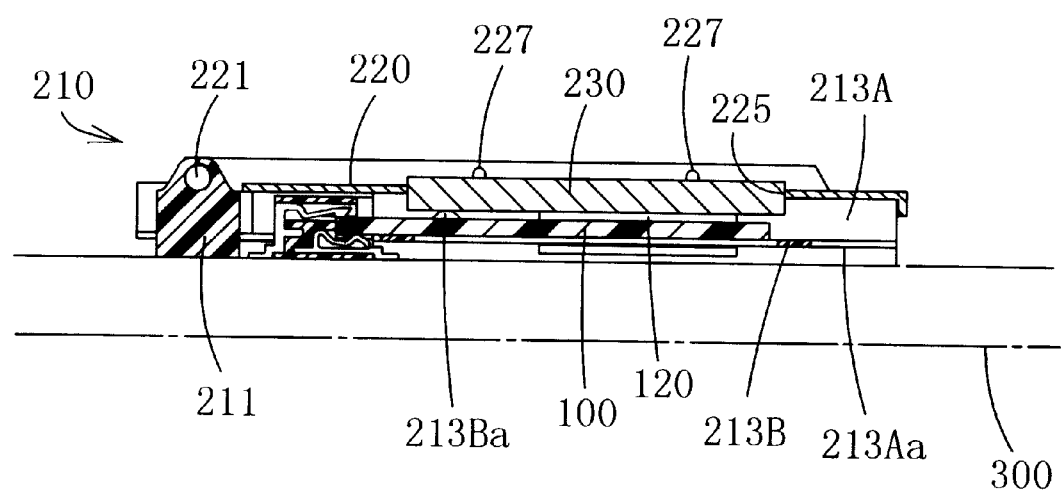
FIG. 28 is a vertical sectional view showing the rear end of the metallic cover is lowered and engaged to the connector body of the fourth embodiment of the connector.

FIG. 21 through FIG. 28 show the fourth embodiment. This fourth embodiment differs from the first embodiment in the supporting structure that enables variation of the angle of fitting the heat sink 230 to the metallic cover 220. Flanges 226 are raised from both the right and left side ends of the metallic cover 220, and guide holes 226a are opened in the flanges 226. On the other hand, the heat sink 230 is provided with rods 227 that extend in the left-right direction, and both ends of each rod 227 are in the above-mentioned guide holes 226a. The guide holes 226a may have a simple form such as a circular hole, but here as shown in FIG. 26 through FIG. 28, each guide hole 226a has an approximately L-shaped form when seen sidewise when the rear end of the metallic cover 220 is down; thus the guide hole 226a comprises a vertical hole 226aa extending in the top-bottom direction and a horizontal hole 226ab that extends in the front-rear direction from the lower end of the vertical hole 226aa. From the view point of balancing, plural rods 227 are provided at intervals in the front-rear direction, and guide holes 226a are opened in the respective flanges 226 to receive the top ends of the rods 227. The diagrams illustrate a form wherein two rods 227 are inserted in the four guide holes 226a. In the case of this connector 200, as shown in FIG. 23 through FIG. 25, when the rear end of the metallic cover 220 is up, the rods 227 are supported in any position in the guide holes 226a. When the metallic cover 220 is put over the module 100 and engaged to it, and as shown in FIG. 26 through FIG. 28, the rods 227 are sled and fitted into the horizontal holes 226ab of the guide holes 226a, because of the supporting structure, the angle of fitting the heat sink 230 to the metallic cover 220 will become variable. Moreover, the metallic cover 220 and the heat sink 230 will be connected with each other elastically by the rods 227, and the heat sink 230 will be energized towards the module. Accordingly, the angle of fitting in this context is not limited to the angle between the heat sink 230 and the metallic cover 220 around a single axis of the first embodiment through the third embodiment. It is the angle between the heat sink 230 and the metallic cover 220 in all directions.

With the arrangement of the fourth embodiment, as the contacting surface of the heat sink 230 is reliably brought to face-to-face contact with the surfaces of semiconductor chips 120, the heat of the semiconductor chips 120 is efficiently transferred to the heat sink 230. Hence the semiconductor chips 120 are cooled well and their operation is maintained stably. In this case, as the angle of fitting the heat sink 230 to the metallic cover 220 is variable in all directions, the ratio of success in the above-mentioned face-to-face touching is improved. Hence cooling of the semiconductor chips 120 is promoted further and their operation is maintained more stably. Moreover, as the heat sink 230 is energized towards the module by this supporting structure, any error in the clearance between the heat sink 230 and the semiconductor chips 120 will be absorbed, and the contacting face of the heat sink 230 will contact the surface of the semiconductor chips 120 with an appropriate pressure. Hence the dispersion of the heat transfer performance from the semiconductor chips 120 to the heat sink 230 among the products can be reduced. This embodiment has a merit that the structure of the supporting structure is simple.

Figure 29:
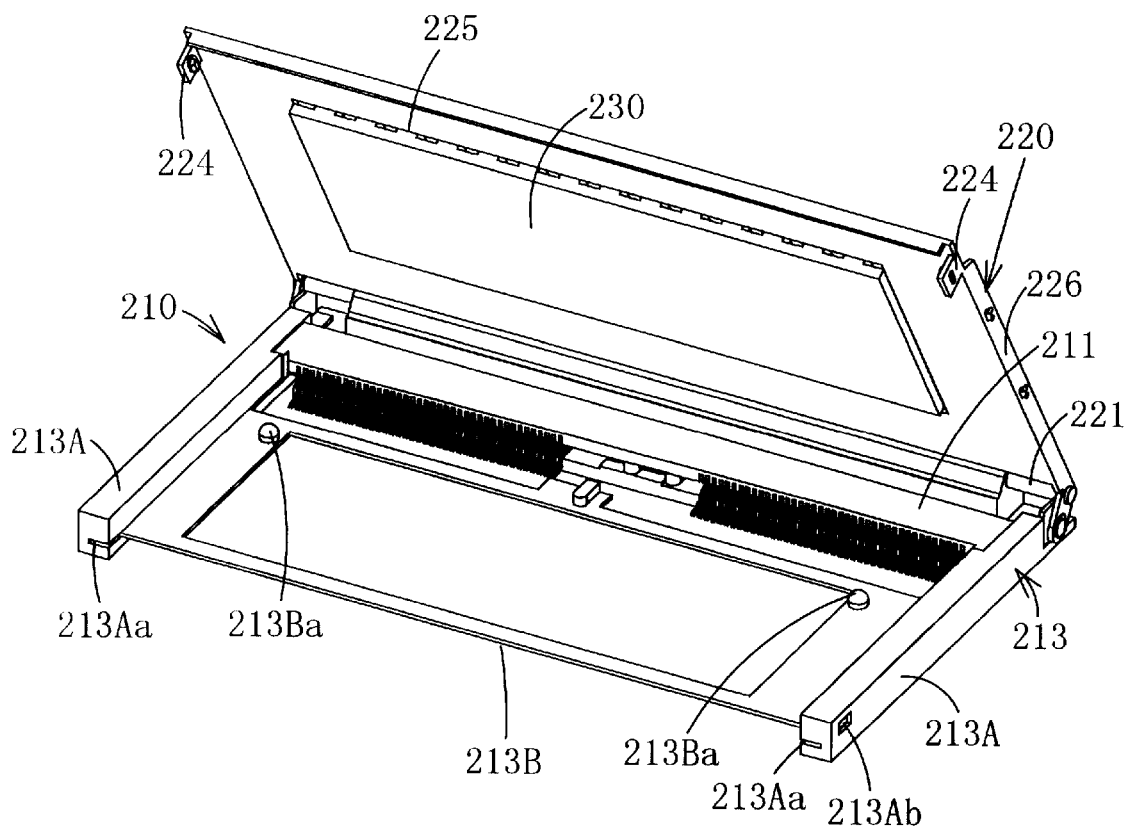
FIG. 29 is a perspective view of the fifth embodiment of the connector.
Figure 30:
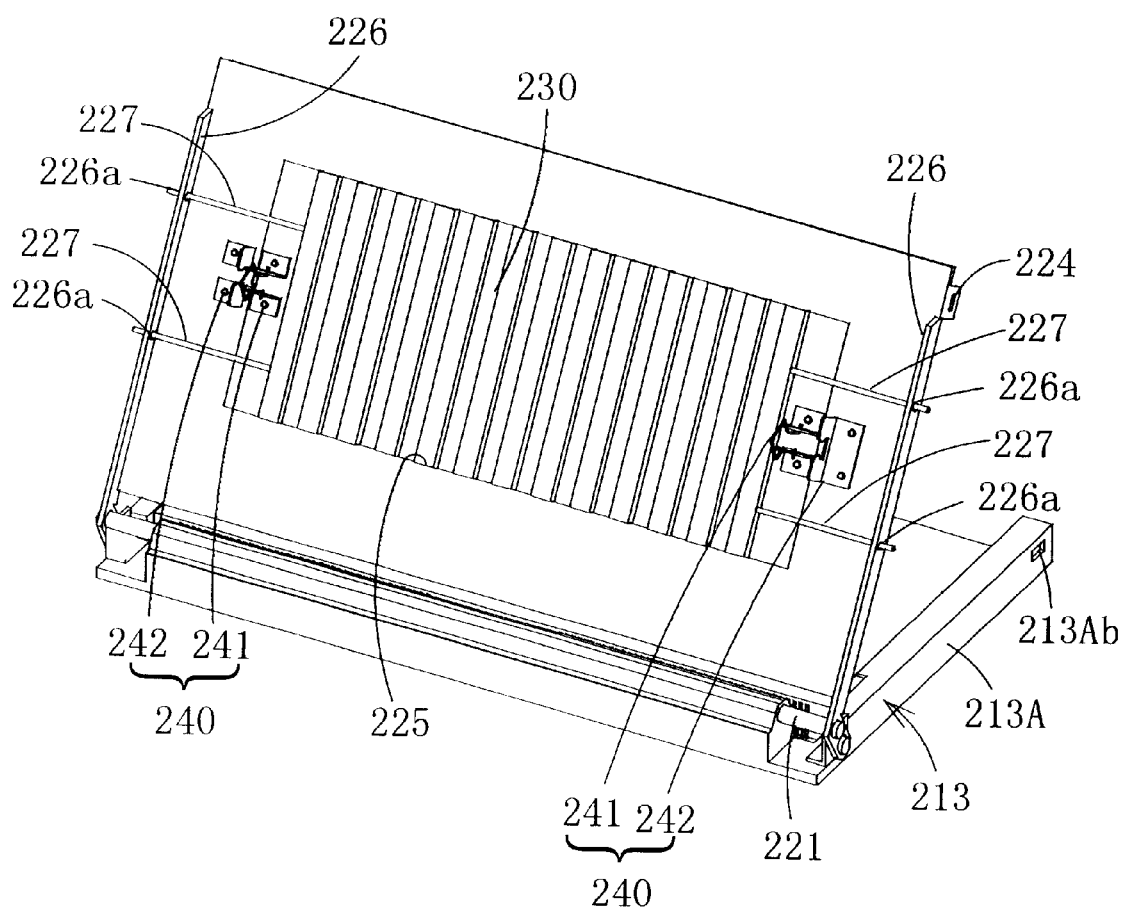
FIG. 30 is a perspective view of the fifth embodiment of the connector seen in a direction opposite to that of FIG. 29.
Figure 31:
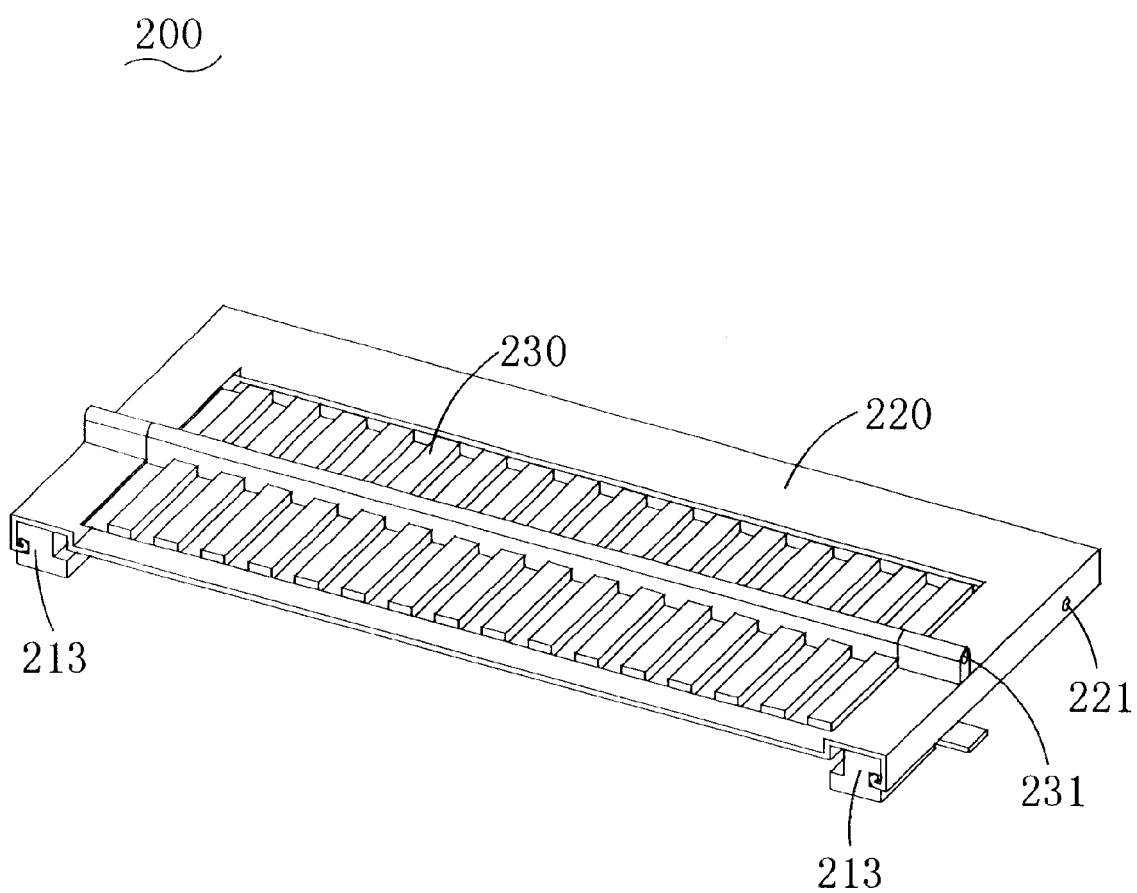
FIG. 31 is a perspective view showing the rear end of the metallic cover is lowered and engaged to the connector body of the sixth embodiment of the connector.
Figure 32:
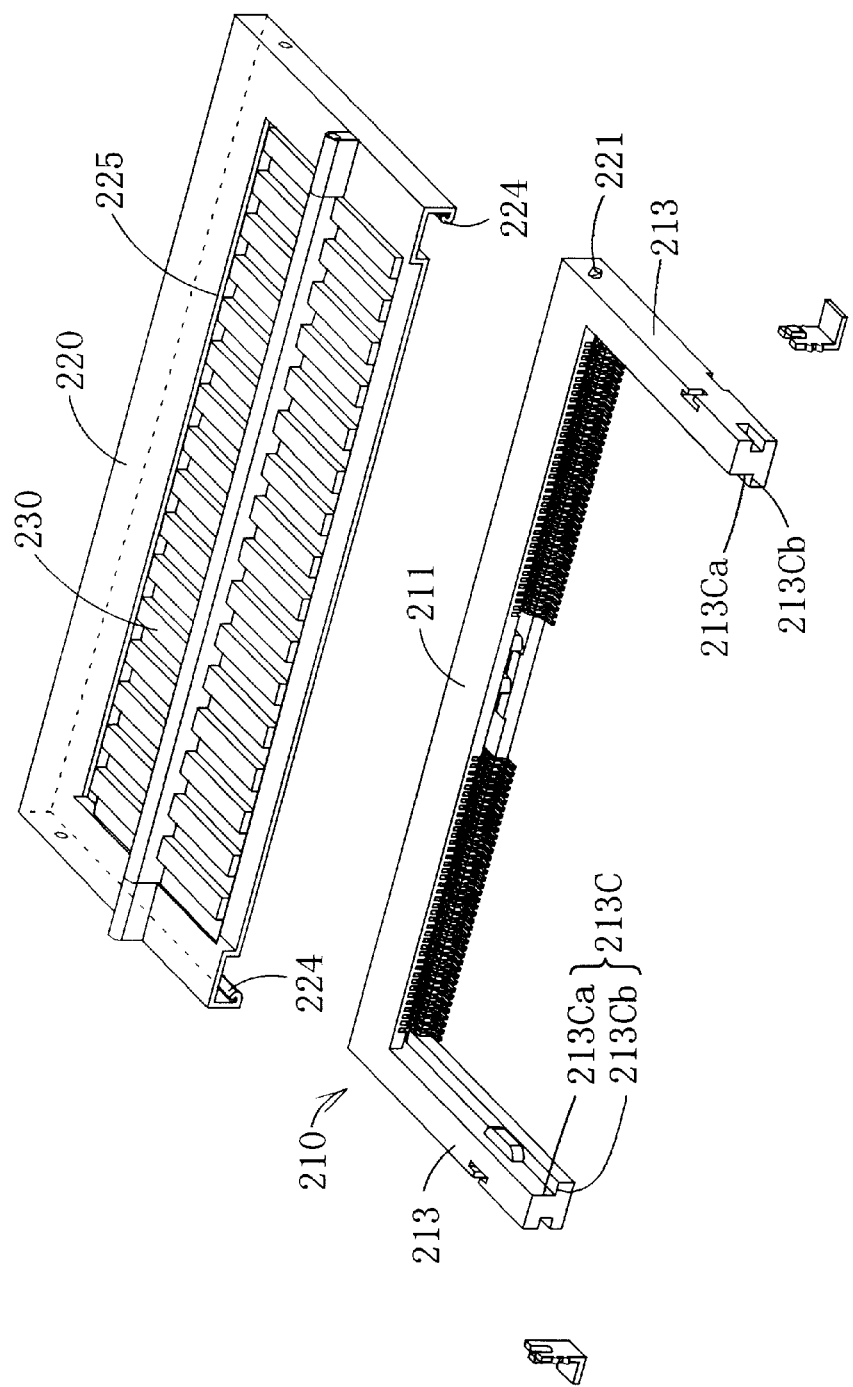
FIG. 32 is a perspective view showing the sixth embodiment of the connector that is disassembled into the connector body and the metallic cover.

FIG. 29 and FIG. 30 show the fifth embodiment. The fifth embodiment results from addition of elastic members 240 to the fourth embodiment. The supporting structure is comprised by opening guide holes 226a in the flanges provided on both right and left side ends of the metallic cover 220, providing the heat sink 230 with rods 227 extending in the left-right direction, and fitting both the ends of the rods 227 in the above-mentioned guide holes 226a. Moreover, elastic members 240 are provided, which energize the heat sink 230 towards the module. Of the elastic members 240, the male members 241 are fixed to both right and left side ends of the face of the heat sink 230, and the female members 242 are fixed to the face of the metallic cover 220, on the left and the right of the window 225.

With the arrangement of the fifth embodiment, as the contacting surface of the heat sink 230 is reliably brought to face-to-face contact with the surfaces of semiconductor chips 120, the heat of the semiconductor chips 120 is efficiently transferred to the heat sink 230. Hence the semiconductor chips 120 are cooled well and their operation is maintained stably. In this case, as the angle of fitting the heat sink 230 to the metallic cover 220 is variable in all directions, the ratio of success in the above-mentioned face-to-face touching is improved. Hence cooling of the semiconductor chips 120 is promoted further and their operation is maintained more stably. Moreover, as the heat sink 230 is energized towards the module by the elastic members 240, any error in the clearance between the heat sink 230 and the semiconductor chips 120 will be absorbed, and the contacting face of the heat sink 230 will contact the surface of the semiconductor chips 120 with an appropriate pressure. Hence the dispersion of the heat transfer performance from the semiconductor chips 120 to the heat sink 230 among the products can be reduced.

FIG. 31 through FIG. 34B show the sixth embodiment. In all the other embodiments mentioned above, the supporting part 213 of the connector body 210 is divided into the bases 213A and the slider 213B, and the slider 213B is connected to the metallic cover 220 by means of links, etc. Raising or lowering the rear end of the metallic cover 220 is linked to move the slider 213B forward or backward, and this in turn inserts and withdraws the conductive pads 130 of the module 100 into or from the space between contacts 212a, 212b. In contrast to them, in the sixth embodiment, the supporting member 213 is not provided with a movable part such as a slider, and the supporting part 213 has no part that is liked to raising or lowering of the rear end of the metallic cover 220.

In this sixth embodiment, supporting parts 213 are two, one at the left and the other at the right, and they extend rearward along the left side and the right side of the module 100 being in the connection position. A stepped part 213C is formed on the inner side of the above-mentioned supporting members 213. The stepped parts 213C have corners that have an L-shape or a reversed-L shape when seen from the rear. The left and right vertical faces 213Ca of the stepped parts 213C support the left side 112 and the right side 113 of the module 100 being in the connection position, and the horizontal faces 213Cb support the bottom 114 of the module 100 being in the connection position. In this case, the supporting part may be provided as one integral form rather than two parts, left one and right one. The integral supporting part extends rearward from the receiving part along the left side, the right side and the bottom of the module being in the connection position. In that case, a stepped part, which has a concave form when seen from the rear, is formed on the above-mentioned supporting member. The left and right vertical faces of the stepped part support the left side 112 and the right side 113 of the module 100 being in the connection position, and the horizontal face being between the two vertical faces supports the bottom 114 of the module 100 being in the connection position.

Figure 33A:
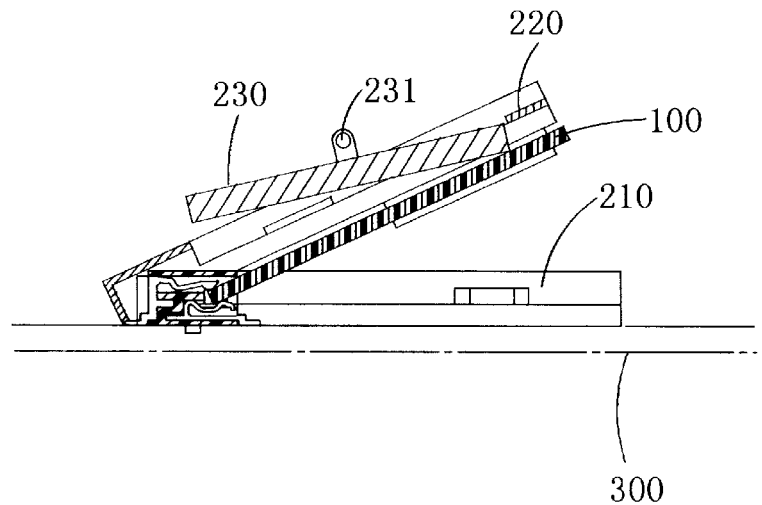
FIG. 33A is a vertical sectional view showing the rear end of the metallic cover is raised and the module is inserted into the sixth embodiment of the connector.
Figure 33B:
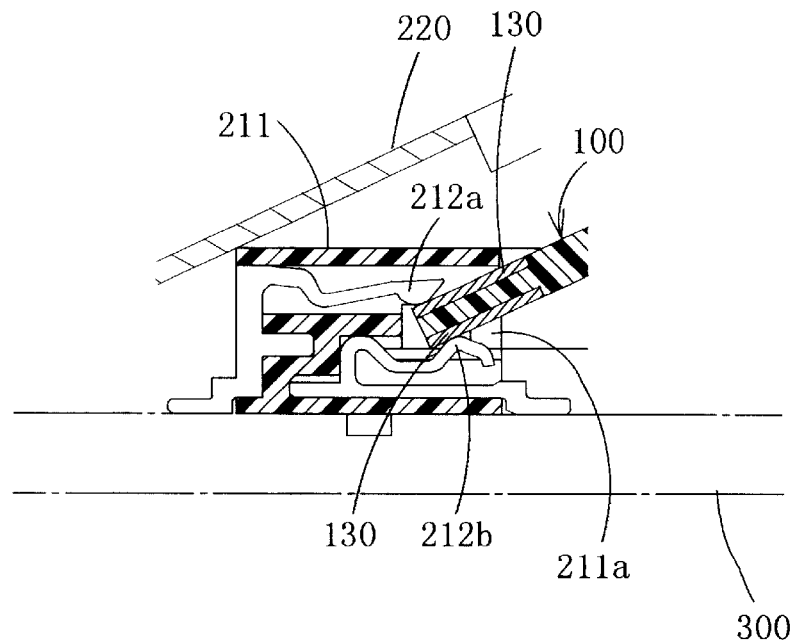
FIG. 33B is a partially magnified view thereof.
Figure 34A:
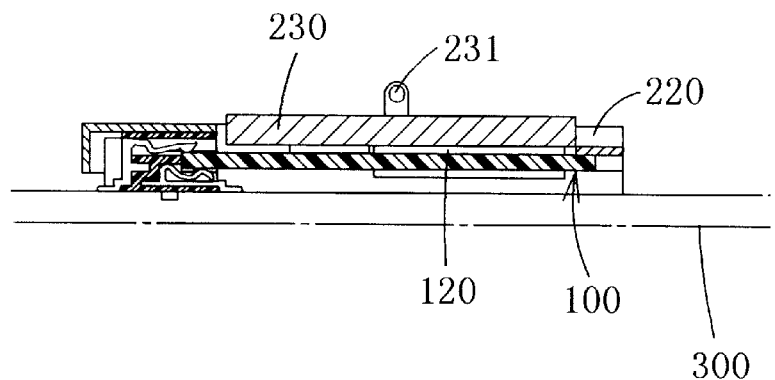
FIG. 34A is a vertical sectional view showing the module is inserted and the metallic cover is lowered and engaged to the connector body of the sixth embodiment of the connector.
Figure 34B:
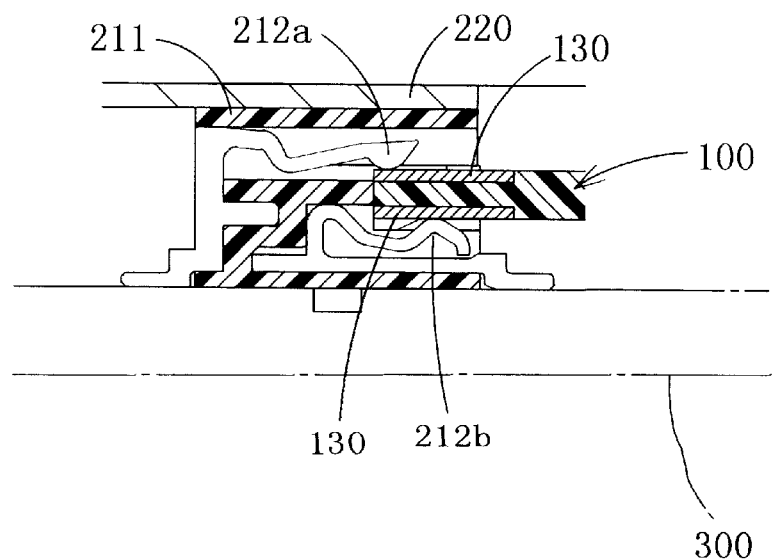
FIG. 34B is a partially magnified view thereof.
Figure 35:
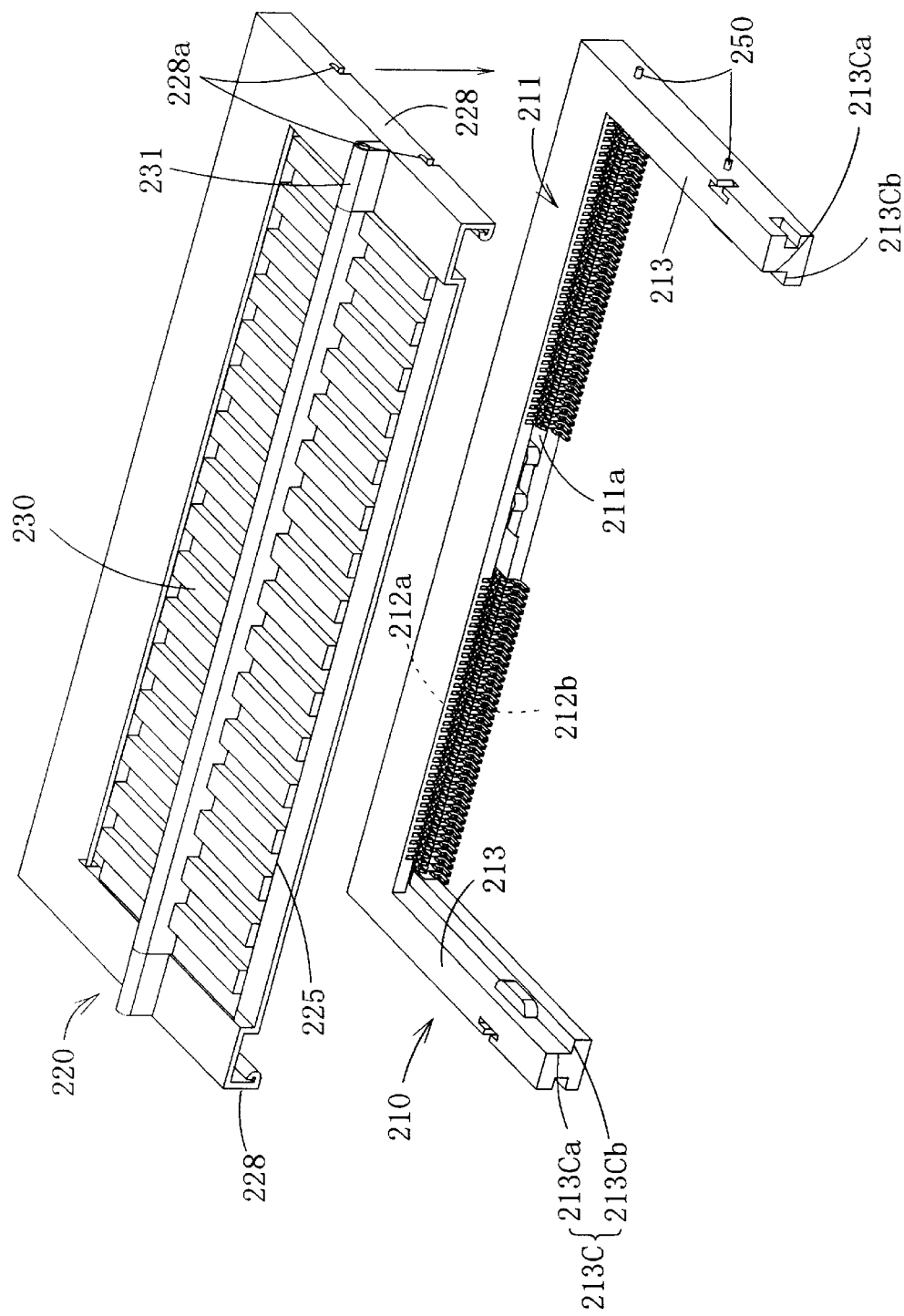
FIG. 35 is a perspective view showing the seventh embodiment of the connector that is disassembled into the connector body and the metallic cover.
Figures 36A, 36B:
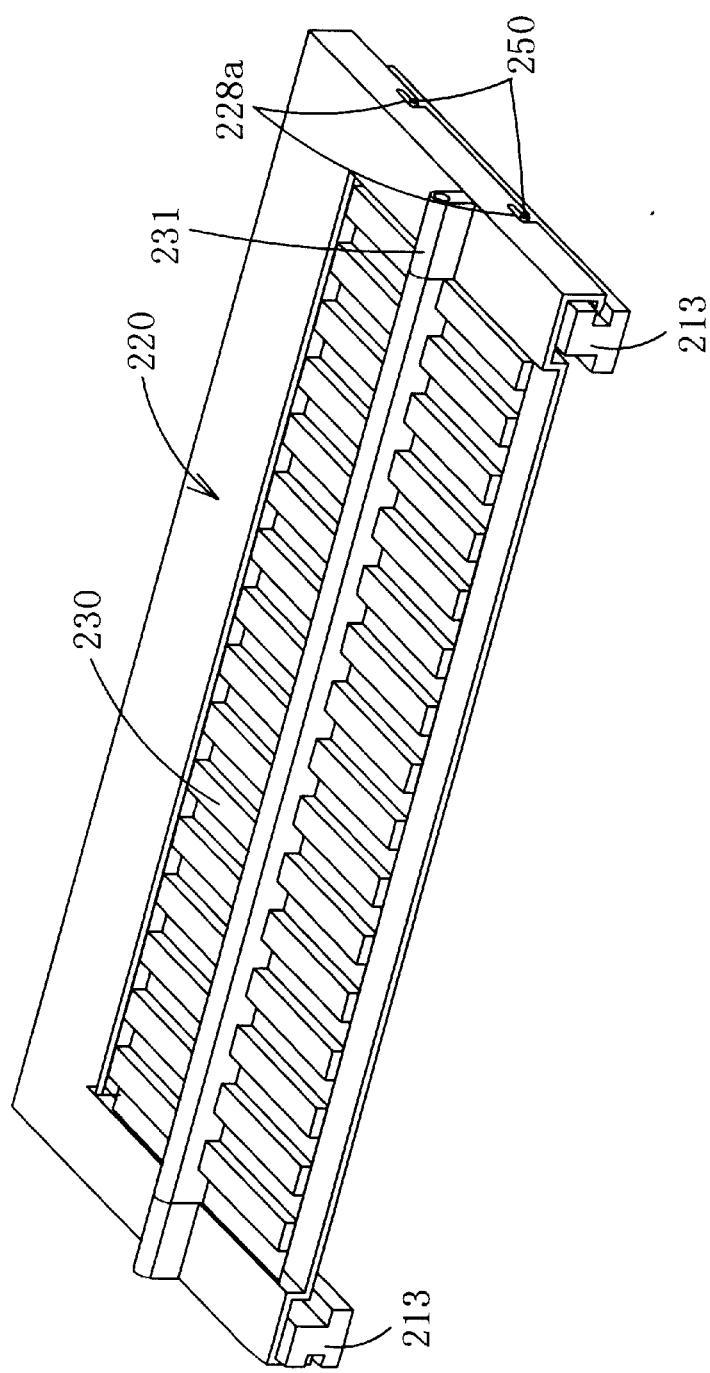
FIG. 36A and FIG. 36B show that the metallic cover is put over the connector body of the seventh embodiment of the connector.

The sixth embodiment of the connector is mounted on the printed circuit board 300 by a method similar to that of the first embodiment. When the module 100 is to be fitted into the connector 200, as shown in FIG. 33A and FIG. 33B, while the rear end of the metallic cover 220 is up, the front side 111 of the module 100 is inserted into the groove 211a of the receiving part 211 to insert the front side 111 into the space between the contacts 212a, 212b. Next, as shown in FIG. 34A and FIG. 34B, the rear end of the metallic cover 220 is lowered, and the metallic cover 220 is put over and engaged to the supporting part 213. The module 100 will be sandwiched between the supporting part 213 and the metallic cover 220 and kept in the connection position. In this case, the positioning of the module 100 in the top-bottom direction is done by the metallic cover 220 and the horizontal face 213Cb of the supporting member, and the positioning of the module 100 in the left-right direction is done by the left and right vertical sides 213Ca of the supporting member 213 to keep the module 100 in the connection position. When the module 100 is to be disconnected from the connector 200, the metallic cover 220 is raised and its engagement to the connector body 210 is undone. Then the module 100 is withdrawn from the receiving part 211 of the connector 200. Positioning of the module 100 may be effected by limiting protrusions like the first embodiment. In the present embodiment, the module 100 is inserted and withdrawn by tilting it, and the module 100 is lowered simultaneously by lowering the rear end of the metallic cover 220 to bring the module 100 into the connection position. As a result, the conductive pads 130 and the contacts 212a, 212b will come into contact with each other. The present invention, however, includes embodiments wherein the module 100 is inserted and withdrawn while being kept parallel to the printed circuit board 300.

Like the first embodiment, the heat sink 230, which contacts the semiconductor chips 120 in the window 225, is connected to the metallic cover 220 by a supporting structure that enables variation of the angle of fitting. The supporting structure of the heat sink 230 is a hinge structure that has a hinge axis 231 being parallel to the hinge axis 221 of the metallic cover 220.

The sixth embodiment is an embodiment wherein the present invention is applied to a connector of which supporting part 213 has not part that is linked to raising and lowering of the rear end of the metallic cover 220, and has functions and desirable effects similar to those of the first embodiment.

FIG. 35 through FIG. 37B show the seventh embodiment. In this seventh embodiment, like the sixth embodiment, the supporting part 213 is not provided with a movable part such as a slider, and the supporting part 213 has no part that is linked to raising and lowering of the rear end of the metallic cover 220. The metallic cover 220 is not hinge-connected to the receiving part 211, and the metallic cover 220 is removably provided to the connector body 210. Inverted-L-shaped guide grooves 228a are formed from the bottoms in the supporting piece 228 that hang from the left end and the right end of the metallic cover 220. The connector body 210 is provided with protrusions 250 of which thickness corresponds to the width of the guide grooves 228a. When the metallic cover 220 is to be put over the connector body 210 and engaged to it, as shown in FIG. 36A and FIG. 36B, the guide grooves 228a are put over the protrusions 250, then as shown in FIG. 37A and FIG. 37B, the metallic cover 220 is slid in the front-rear direction (rearwards in the diagram) to guide the terminal ends of the guide grooves 228a onto the protrusions 250. This completes the engagement. To undo the engagement of the metallic cover 220 to the connector body 210, the metallic cover 220 is slid in the front-rear direction (forwards in the diagram) and the terminal ends of the guide grooves 228a are withdrawn from the protrusions 250. Then the metallic cover 220 is lifted to undo the engagement.

The seventh embodiment of the connector is mounted on the printed circuit board 300 by a method similar to that of the first embodiment. When the module 100 is to be fitted into the connector 200, while the metallic cover 220 is off the connector body 210, the front side of the module 100 is put into the groove 211a of the receiving part 211 and the front side 111 is pushed into the space between the contacts 212a, 212b. Then the metallic cover 220 is put over the connector body 210 and engaged to it. The module 100 will be sandwiched between the support part 213 and the metallic cover 220 and kept in the connection position. In this case, positioning of the metallic cover in the respective directions may be done, as illustrated, by means of the stepped parts 213C like the sixth embodiment, or by means of the limiting protrusions like the first embodiment.

Moreover, like the first embodiment, the heat sink 230, which contacts the semiconductor chips 120 in the window 225, is connected to the metallic cover 220 by a supporting structure that enables variation of the angle of fitting. The supporting structure of the heat sink 230 is a hinge structure that has a hinge axis 231 extending in the left-right direction.

The seventh embodiment is an application of the present invention to an embodiment wherein the metallic cover 220 is not hinge-connected to the receiving part 211 and the metallic cover 220 is removably provided to the connector body 210, and can exhibit functions and desirable effects similar to those of the first embodiment. When the metallic cover 220 is removed, the contacts 212a, 212b will be exposed and allow easy visual inspection. Thus insertion of the module 100 can be done easily.

Figure 38:
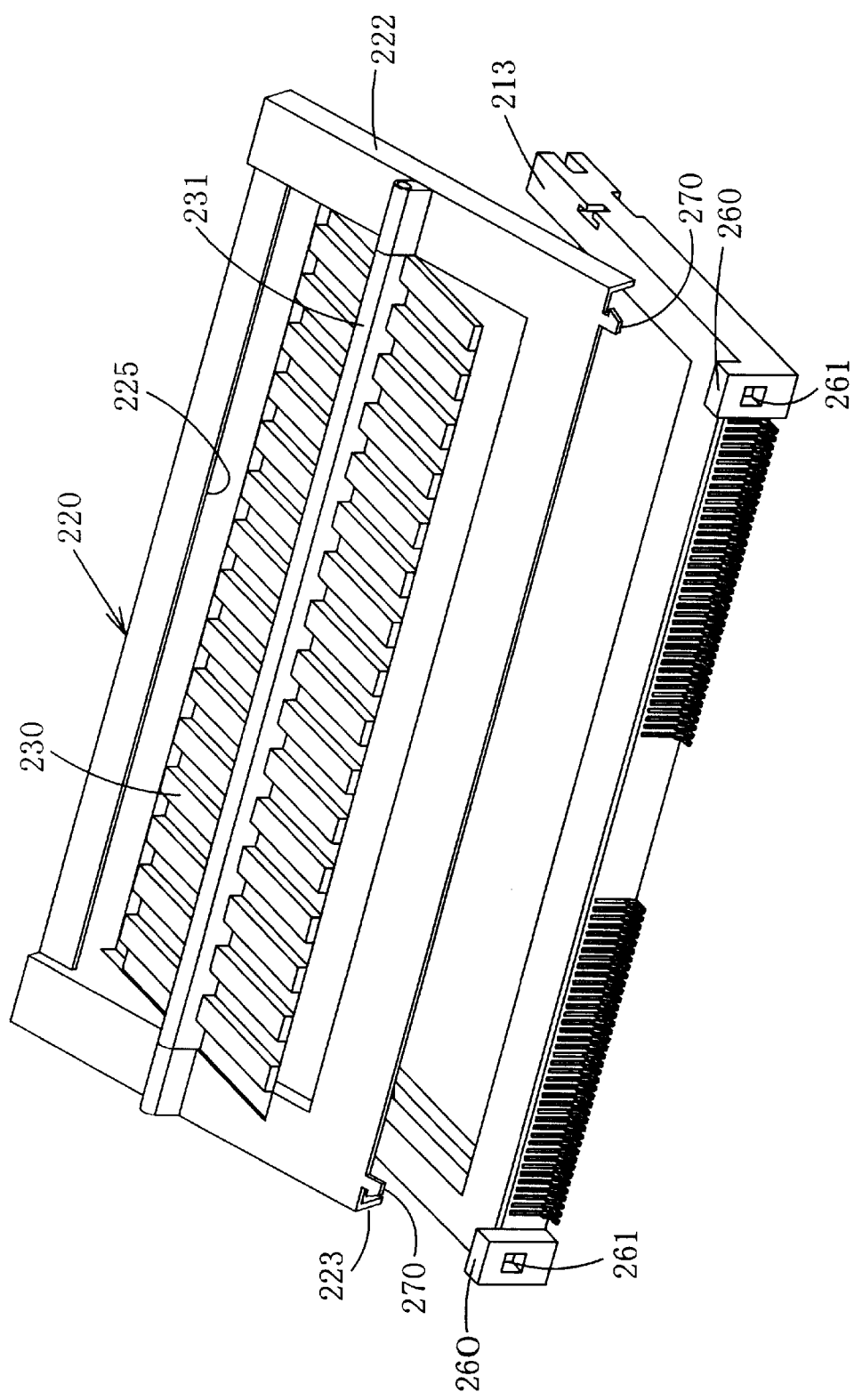
FIG. 38 is a perspective view showing protrusions of the metallic cover are being inserted into the receiving holes of the stopping walls of the eighth embodiment of the connector.

FIG. 38 shows the eighth embodiment. In this eighth embodiment, like the first embodiment, the metallic cover 220 is hinge-connected to the receiving part 211. This hinge structure is separated into parts and the metallic cover 220 is removably provided to the connector body 210. Stopping walls 260 are provided at the left and the right of the receiving part 211 to protrude upwards. The stopping walls 260 are provided with holes 261 that are through in the front-rear direction or open at the rear. Protruding protrusions 270 are formed at the left and the right of the front of the metallic cover 220. To put the metallic cover 220 over the connector body 210 and engage the metallic cover 220 to the connector body 210, the protrusions 270 of the metallic cover 220 are inserted into the holes 261 of the stopping walls 260 to make the hinge connection. The subsequent procedure is similar to that of the sixth embodiment. The module 100 is inserted, and the metallic cover 220 is lowered to engage the metallic cover 220 to the connector body by the connecting structure. Then the module 100 can be maintained in the connection position. When the rear end of the metallic cover 220 is up, if the metallic cover 220 is pulled rearward and upward, the protrusions 270 of the metallic cover 220 will come out of the holes 261 of the stopping walls 260 and the metallic cover 220 will be disconnected from the connector body 210.

Like the first embodiment, the heat sink 230, which contacts the semiconductor chips 120 in the window 225, is connected to the metallic cover 220 by a supporting structure that enables variation of the angle of fitting. The supporting structure of the heat sink 230 is a hinge structure that has a hinge axis 231 extending in the left-right direction.

The eighth embodiment is an application of the present invention to an embodiment wherein the metallic cover 220 is hinge-connected to the receiving part 211 and the metallic cover 220 is removably provided to the connector body 210, and can exhibit functions and desirable effects similar to those of the first embodiment. When the metallic cover 220 is removed, the contacts 212a, 212b will be exposed and allow easy visual inspection. Thus insertion of the module 100 can be done easily.

The present invention includes all embodiments that combine any of the features of the above-mentioned embodiments.

With the description of these embodiments, the first connector for module of the present invention that was described in Summary above has been fully disclosed. With the description of these embodiments, a second and third connectors for module according to the first connector for module that will be described below have been fully substantiated.

A second connector for module according to the first connector for module wherein, the metallic cover is so constructed that it is hinged at the front to the receiving part and the rear end of the metallic cover can be lifted. With this arrangement, the metallic cover will be engaged to the connector body when the rear end of the metallic cover is lowered, and the metallic cover will be disconnected from the connector body when the rear end of the metallic cover is lifted. Thus engagement and removal of the metallic cover can be done easily with a single touch. With this structure, if there is a positional error of the hinge axis, the metallic cover and the module will have a lower parallelism when the rear end of the metallic cover is lowered. In such a case, however, the supporting structure corrects the parallelism between the contacting surface of the heat sink and the surface of the semiconductor chip. Thus both surfaces will make face-to-face contact reliably. Hence the heat of the semiconductor chip is transferred to the heat sink efficiently, and the semiconductor chip is cooled well to maintain its operation stably.

A third connector for module according to the first or the second connector for module wherein, the supporting structure of the heat sink is a hinge structure and its hinge axis is parallel to the board of the module being in the connection position and is off the center of gravity of the heat sink in an upward direction. With this arrangement, the heat sink will change is angle of fitting to the metallic cover by turning around the hinge axis. This supporting structure is simple in construction. Moreover, as hinge axis is parallel to the board of the module being in the connection position and is off the center of gravity of the heat sink in an upward direction, when the rear end of the metallic cover is up, the contacting surface of the heat sink will be held horizontally and turns downward, and when the metallic cover is down, the contacting surface of the heat sink will automatically contact the surfaces of the semiconductor chip. Thus operability is high.

What is claimed is:

1. A connector for module that connects a module, which has a semiconductor chip mounted on a rectangular board and has a conductive pad on the front side of the board, to a printed circuit board in a position wherein the board plane is approximately parallel to the printed circuit board, said connector for module, comprising:

a connector body having a receiving part that extends along the front side of the module being in the connection position, having a contact that is provided in the receiving part and contacts the conductive pad while allowing the pad to shift in the direction of insertion/withdrawal, and having a supporting part that extends rearward from the receiving part to carry the module being in the connection position and limits shifting of the module in the front-rear direction and the left-right direction;

a metallic cover that is put over and is engaged to the connector body to sandwich the module between itself and the supporting part and keep the module in the connection position, having a window for exposing the semiconductor chip of the module being in the connection position; and a heat sink that is arranged to contact the semiconductor chip in the window and is connected to the metallic cover by a supporting structure that enables variation of the angle of fitting to the metallic cover.

2. A connector for module according to claim 1, wherein said metallic cover is so constructed that it is hinged at the front to the receiving part and the rear end of the metallic cover can be lifted.

3. A connector for module according to claim 1 wherein the supporting structure of the heat sink is a hinge structure and its hinge axis is parallel to the board of the module being in the connection position and is off the center of gravity of the heat sink in an upward direction.

4. A connector for module according to claim 2 wherein the supporting structure of the heat sink is a hinge structure and its hinge axis is parallel to the board of the module being in the connection position and is off the center of gravity of the heat sink in an upward direction.

* * * * *